United States Patent
Hoshi et al.

(10) Patent No.: US 9,084,364 B2
(45) Date of Patent: Jul. 14, 2015

(54) PRINTED CIRCUIT BOARD AND PRINTED WIRING BOARD

(71) Applicant: CANON KABUSHIKI KAISHA, Tokyo (JP)

(72) Inventors: Sou Hoshi, Miura (JP); Nobuaki Yamashita, Yokohama (JP); Yusuke Murai, Kawasaki (JP); Tohru Ohsaka, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 223 days.

(21) Appl. No.: 13/916,443

(22) Filed: Jun. 12, 2013

(65) Prior Publication Data
US 2013/0343024 A1   Dec. 26, 2013

(30) Foreign Application Priority Data

Jun. 20, 2012   (JP) ................................ 2012-138898

(51) Int. Cl.
*H05K 7/00*   (2006.01)
*H05K 1/18*   (2006.01)
*H05K 1/02*   (2006.01)

(52) U.S. Cl.
CPC .............. *H05K 1/181* (2013.01); *H05K 1/0262* (2013.01); *H05K 1/0228* (2013.01); *H05K 2201/09309* (2013.01); *H05K 2201/10689* (2013.01)

(58) Field of Classification Search
CPC ... H05K 1/0228; H05K 1/0262; H05K 1/181; H05K 2201/09309; H05K 2201/10689
USPC ......... 361/760, 783, 763, 765, 811, 502, 830, 361/821, 784; 174/260, 261
See application file for complete search history.

(56) References Cited

U.S. PATENT DOCUMENTS

| | | | |
|---|---|---|---|
| 5,090,113 A | 2/1992 | Umetsu et al. | |
| 5,289,625 A | 3/1994 | Umetsu et al. | |
| 5,892,275 A * | 4/1999 | McMahon | 257/690 |
| 5,912,809 A * | 6/1999 | Steigerwald et al. | 361/780 |
| 6,335,866 B1 | 1/2002 | Ohtaki et al. | |
| 6,366,467 B1 * | 4/2002 | Patel et al. | 361/760 |
| 6,515,868 B1 * | 2/2003 | Sasaki et al. | 361/760 |
| 7,594,105 B2 | 9/2009 | Ohsaka | |

(Continued)

FOREIGN PATENT DOCUMENTS

JP   2001-119110 A   4/2001

OTHER PUBLICATIONS

U.S. Appl. No. 13/852,630, filed Mar. 28, 2013 by Murai et al.

*Primary Examiner* — Yuriy Semenenko
(74) *Attorney, Agent, or Firm* — Fitzpatrick, Cella, Harper & Scinto

(57) ABSTRACT

On a surface layer of a printed wiring board, main power supply patterns to be applied with different DC voltages are disposed in a second region. Power supply patterns are disposed on the surface layer, and the power supply patterns are led from the main power supply patterns to a first region. The power supply patterns connect power supply terminals of terminal groups in the second region. The power supply patterns connect the power supply terminals between the terminal groups in the first region. Power supply terminals of the terminal groups of a semiconductor package are electrically connected to the main power supply patterns by the power supply patterns. Thus, potential fluctuations are reduced and radiation noise is suppressed, and the number of layers of the printed wiring board is reduced.

21 Claims, 11 Drawing Sheets

(56) References Cited

U.S. PATENT DOCUMENTS

| | | | |
|---|---|---|---|
| 7,719,850 B2 * | 5/2010 | Duerbaum et al. | 361/760 |
| 8,013,691 B2 * | 9/2011 | Okano | 333/181 |
| 8,063,480 B2 * | 11/2011 | Mukaibara | 257/691 |
| 8,208,338 B2 * | 6/2012 | Kim | 365/226 |
| 8,422,241 B2 * | 4/2013 | Higashibata et al. | 361/758 |

* cited by examiner

PRINTED CIRCUIT BOARD AND PRINTED WIRING BOARD

BACKGROUND OF THE INVENTION

1. Field of the Invention

The present invention relates to a printed circuit board having a semiconductor package mounted on a printed wiring board, and a printed wiring board having a semiconductor package mounted thereon.

2. Description of the Related Art

In recent years, along with an increase in current consumption of a large-scale integration (hereinafter referred to as "LSI") as a semiconductor package, a malfunction of the LSI caused by a power supply potential fluctuation has been a problem.

When the LSI operates, a potential fluctuation occurs, which is determined by the product of impedance of a power supply path between the LSI and a power supply circuit, and a current flowing on the power supply path. If a power supply potential fluctuation is large, a power supply voltage for driving the LSI becomes short so that a malfunction may occur. Further, the power supply potential fluctuation propagates to a cable or the like connected to a printed circuit board, and radiation noise is generated from the cable or the like as an antenna so as to cause a malfunction of peripheral electronic devices.

Therefore, it is required to reduce the power supply potential fluctuation of the LSI and to suppress the propagation thereof. As a technology to reduce the power supply potential fluctuation, there is a technology of reducing impedance of the power supply path for the LSI. In addition, as a technology to reduce the propagation of the power supply potential fluctuation, there is a decoupling technology of electrically decoupling in a high frequency range.

Conventionally, as a technology to reduce impedance of the power supply path for the LSI, there is known a technology of connecting power supply wirings in parallel between a semiconductor element in the LSI and power supply terminals by connecting multiple power supply terminals of the LSI to a main power supply pattern with multiple power supply patterns at multiple points (Japanese Patent Application Laid-Open No. 2001-119110). This parallel effect can reduce impedance of the power supply path for the LSI so as to reduce the power supply potential fluctuation. In Japanese Patent Application Laid-Open No. 2001-119110, the power supply pattern connected to the power supply circuit is disposed on a power supply layer disposed as an inner layer of the printed wiring board. In addition, on a surface layer of the printed wiring board, there is formed a power supply pattern for connecting multiple power supply terminals of the LSI to each other. The power supply pattern on the surface layer and the main power supply pattern on the inner layer are connected to each other using vias.

In recent years, multiple power supplies for the LSI have been used, and there is an LSI having multiple power supply terminal groups so as to support individual DC voltages. As for the printed wiring board on which this type of LSI is mounted, it is necessary to form multiple main power supply patterns to be applied with different DC voltages. On the other hand, in order to reduce cost, it is demanded to eliminate the power supply layer as the inner layer of the printed wiring board and to form the power supply patterns on the surface layer together with signal wiring patterns.

When the multiple power supply patterns extending from the multiple main power supply patterns applied with different DC voltages are formed for the multiple power supply terminals, it is necessary to form wirings so that the main power supply patterns do not cross each other to be short-circuited. As described in Japanese Patent Application Laid-Open No. 2001-119110, it is possible to form wirings so that the main power supply patterns do not cross each other to be short-circuited if the power supply layer for arranging the main power supply patterns is formed as the inner layer of the printed wiring board. However, if the power supply pattern is formed on the surface layer of the printed wiring board together with the signal wiring patterns, and if the power supply patterns are formed from surrounding regions of the LSI to the power supply terminals of the LSI, the power supply patterns always cross each other. Therefore, it is not possible to connect the power supply terminals of the LSI applied with different DC voltages to the power supply patterns on the surface layer. Therefore, it is not possible to reduce the number of layers of the printed wiring board.

SUMMARY OF THE INVENTION

Therefore, it is an object of the present invention to reduce the number of layers of a printed wiring board while reducing a power supply potential fluctuation and suppressing radiation noise when an LSI requiring multiple power supplies is mounted on the printed wiring board.

A printed circuit board according to an aspect of the present invention includes a printed wiring board and a semiconductor package mounted on a surface layer of the printed wiring board.

The printed wiring board includes: a first main power supply pattern to be applied with a first DC voltage, a second main power supply pattern to be applied with a second DC voltage different from the first DC voltage; a first power supply pattern which is formed on the surface layer and is electrically connected to the first main power supply pattern; and a second power supply pattern which is formed on the surface layer and is electrically connected to the second main power supply pattern.

The semiconductor package includes: a main body part including a semiconductor element which drives with the first DC voltage and the second DC voltage; and multiple terminal groups which are electrically connected to the semiconductor element and are arranged with spaces in a circumferential direction of the main body part so as to protrude externally from the main body part.

Each of the multiple terminal groups includes: first and second power supply terminals to be supplied with the first DC voltage via the first power supply pattern; and third and fourth power supply terminals to be supplied with the second DC voltage via the second power supply pattern, the third and fourth power supply terminals being disposed to sandwich the first and second power supply terminals. The first to fourth power supply terminals are disposed in order of the third, first, second, and fourth power supply terminals in the each of the multiple terminal groups.

When a region of the surface layer opposed to the main body part is defined as a first region and a region of the surface layer other than the first region is defined as a second region, the first power supply pattern extending from the first main power supply pattern is led from the second region to the first region and is wired to connect the first and second power supply terminals of the multiple terminal groups. The second power supply pattern extending from the second main power supply pattern is led from the second region to the first region and is wired in a single stroke manner so as to connect the third and fourth power supply terminals of the multiple terminal groups in this order. The third power supply terminal and the fourth power supply terminal in the same terminal group are connected to each other in the second region. The third power supply terminal of one of two different terminal groups among the multiple terminal groups and the fourth power supply terminal of another one of the two different terminal groups are connected to each other in the first region. The second power supply pattern is disposed on an outer perimeter side of the semiconductor package with respect to the first power supply pattern when viewed from a center of the semiconductor package.

Further features of the present invention will become apparent from the following description of exemplary embodiments with reference to the attached drawings.

DESCRIPTION OF THE EMBODIMENTS

Embodiments of the present invention are described in detail below with reference to the accompanying drawings.

First Embodiment

Figure 1:
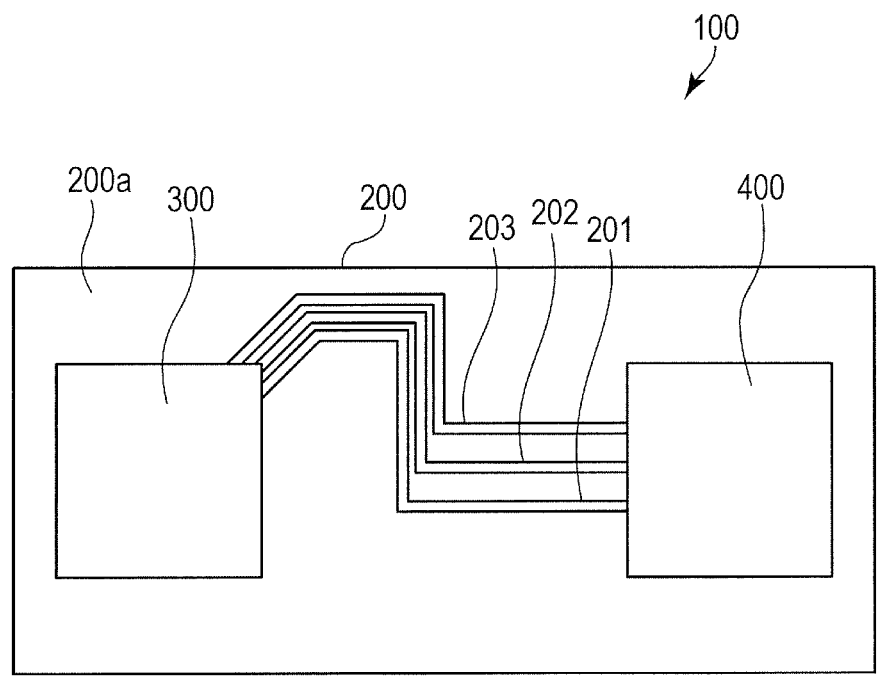
FIG. 1 is a plan view illustrating a schematic structure of a printed circuit board according to a first embodiment of the present invention.

FIG. 1 is a plan view illustrating a schematic structure of a printed circuit board according to a first embodiment of the present invention. A printed circuit board 100 illustrated in FIG. 1 includes a printed wiring board 200, an LSI 300 as a semiconductor package that is mounted on another layer 200a of the printed wiring board 200, and a power supply circuit 400 that is mounted on the surface layer 200a and supplies power to the LSI 300.

The LSI 300 is an LSI that requires multiple power supplies, namely an LSI that operates when multiple different DC voltages are applied. The power supply circuit 400 supplies the multiple different DC voltages.

The LSI 300 and the power supply circuit 400 are electrically connected by first to third main power supply patterns 201 to 203 as conductor patterns disposed on the surface layer 200a of the printed wiring board 200. The power supply circuit 400 applies the multiple different DC voltages to the LSI 300 via the main power supply patterns 201 to 203 so as to operate the LSI 300. On the surface layer 200a of the printed wiring board 200, there are disposed signal wiring patterns (not shown) that are electrically connected to the LSI 300. Here, the main power supply pattern in the present invention means a wiring pattern formed to have a small inductance for suppressing a power supply voltage drop when a power supply voltage is supplied from a source power supply to the LSI. In contrast, the power supply pattern means a wiring pattern having a large inductance for connecting the main power supply pattern to the LSI or the like. Therefore, a general main power supply pattern has a wiring width larger than that of the power supply pattern, and also has a region larger than that of the power supply pattern.

Figure 2A:
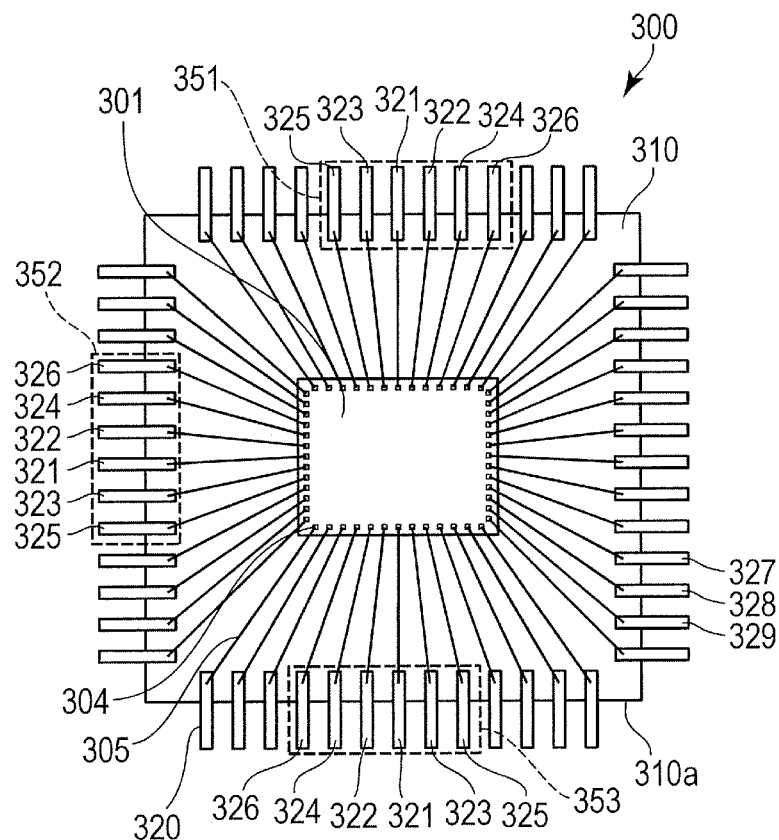
FIGS. 2A and 2B are conceptual diagrams illustrating a schematic structure of an LSI according to the first embodiment.
Figure 2B:
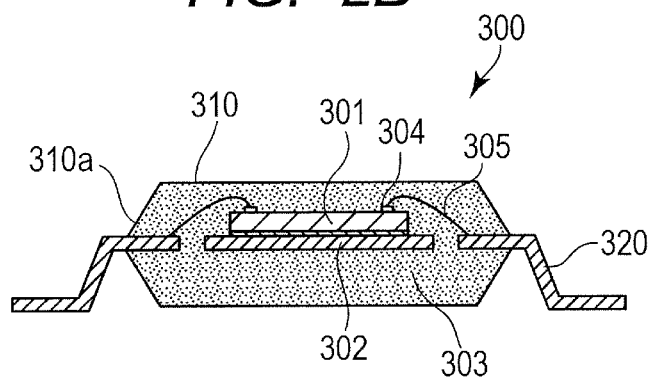

FIGS. 2A and 2B are explanatory diagrams illustrating a schematic structure of the LSI. FIG. 2A is a plan view of the LSI in which an upper half of a sealing resin is omitted, and FIG. 2B is a cross-sectional view of the LSI. The LSI 300 is a quad flat package (QFP) type semiconductor package in the first embodiment.

As illustrated in FIG. 2B, the LSI 300 includes a semiconductor chip (semiconductor element) 301, a die pad 302 for supporting the semiconductor chip 301, and a sealing resin 303 for sealing the semiconductor chip 301. The semiconductor chip 301, the die pad 302, and the sealing resin 303 constitute a main body part 310.

A shape of the main body part 310 in a plan view (a shape viewed from the direction perpendicular to a plane of the main body part) is a polygon, which is a square or a rectangle, for example, as illustrated in FIG. 2A.

The LSI 300 includes multiple terminals (leads) 320 protruding externally from a side surface 310a of the main body part 310. These terminals 320 are arranged with spaces in a circumferential direction of the main body part 310. In the first embodiment, these terminals 320 are arranged with predetermined spaces in the circumferential direction on the sides of the main body part 310, and there is no terminal in corner parts of the main body part 310.

The semiconductor chip 301 includes multiple electrode pads 304 formed on a top surface thereof. Each of the electrode pads 304 and each of the terminals 320 are electrically connected via a metal wire 305. Thus, the semiconductor chip 301 and the terminals 320 are electrically connected.

In the first embodiment, these multiple terminals 320 include multiple terminal groups 351, 352, and 353 having a plurality (six in FIGS. 2A and 2B) of power supply terminals. In other words, the LSI 300 includes multiple terminal groups having multiple power supply terminals. Specifically, each of the terminal groups 351, 352, and 353 has first to sixth power supply terminals 321 to 326. In addition, the multiple terminals 320 include seventh to ninth power supply terminals 327, 328, and 329.

The terminal groups 351, 352, and 353 are arranged with spaces in the circumferential direction of the main body part 310. More specifically, the terminal groups 351, 352, and 353 are respectively arranged in three sides among the four sides of the rectangular main body part 310. The power supply terminals 327, 328, and 329 are arranged in the remaining one side among the four sides of the rectangular main body part 310. Among these multiple terminals 320, other terminals than the terminal groups 351, 352, and 353 and the power supply terminals 327, 328, and 329 are signal terminals, ground terminals, or power supply terminals for voltages different from those of the power supply terminals 327, 328, and 329.

Between the terminal group 351 and the terminal group 352, there are arranged signal terminals or ground terminals as terminals other than the power supply terminals. Further, between the terminal group 352 and the terminal group 353, there are arranged signal terminals or ground terminals as terminals other than the power supply terminals.

The semiconductor chip 301 operates when applied with two or more types of DC voltages, which are three types of DC voltages (for example, 1.0 V, 1.8 V, and 3.3 V) in the first embodiment. The first power supply terminal 321 and the second power supply terminal 322 of each of the terminal groups 351, 352, and 353 are supplied with the same DC voltage (for example, 1.0V). The third power supply terminal 323 and the fourth power supply terminal 324 of each of the terminal groups 351, 352, and 353 are supplied with the same DC voltage (for example, 1.8 V). The fifth power supply terminal 325 and the sixth power supply terminal 326 of each of the terminal groups 351, 352, and 353 are supplied with the same DC voltage (for example, 3.3 V). Further, different DC voltages are supplied among the power supply terminals 321 and 322, the power supply terminals 323 and 324, and the power supply terminals 325 and 326. Further, different DC voltages are supplied to the power supply terminals 327, 328, and 329. In other words, the semiconductor chip 301 operates when the power supply terminals 321, 322, and 327 are supplied with a 1.0 V DC voltage, for example, the power supply terminals 323, 324, and 328 are supplied with a 1.8 V DC voltage, for example, and the power supply terminals 325, 326, and 329 are supplied with a 3.3 V DC voltage, for example.

In the terminal groups 351 to 353, the power supply terminal 323 and the power supply terminal 324 are disposed to sandwich the power supply terminals 321 and 322, while the power supply terminal 325 and the power supply terminal 326 are disposed to sandwich the power supply terminals 323 and 324 (and power supply terminals 321 and 322). These power supply terminals 321 to 326 are arranged continuously in the first embodiment, but another terminal (for example, a signal terminal) may be disposed between these terminals. However, in all the terminal groups 351 to 353, the power supply terminals 321 to 326 need to be arranged in the same order.

Figure 3:
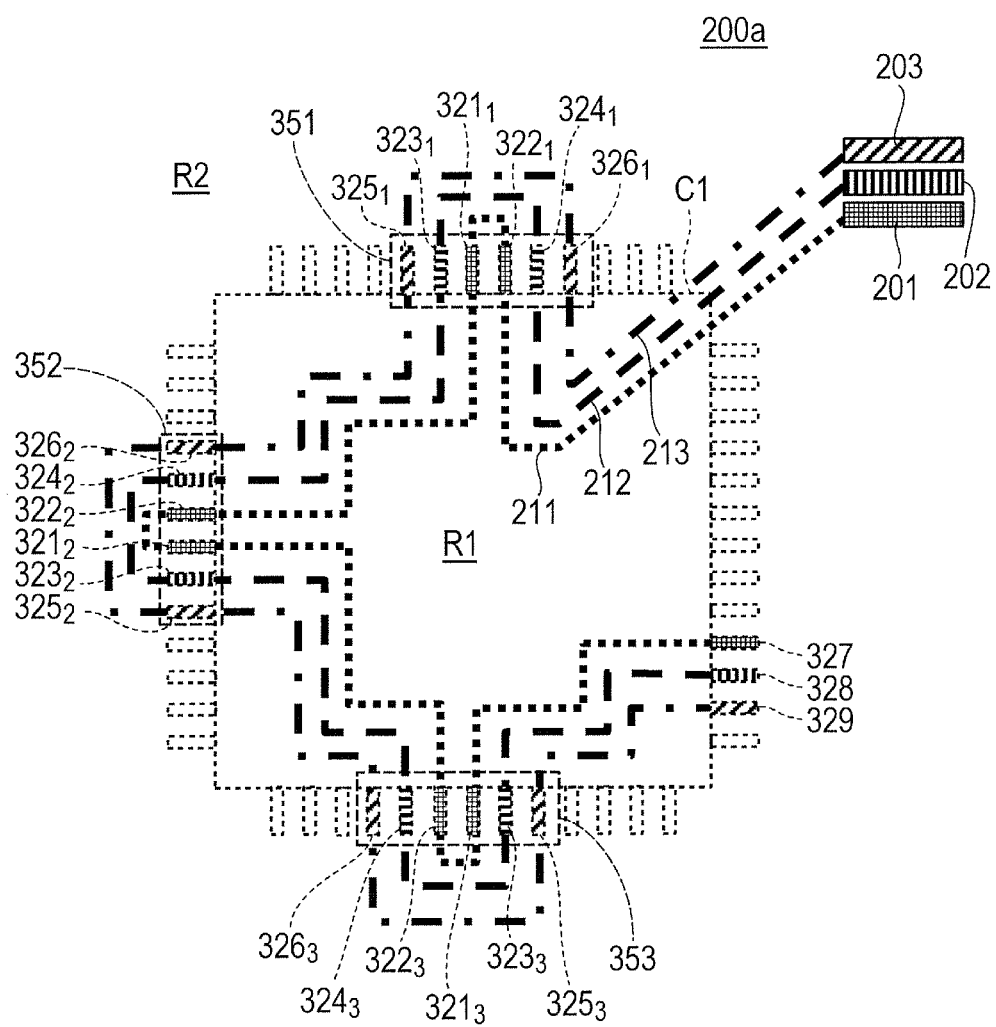
FIG. 3 is a plan view of a printed wiring board in a vicinity of the LSI according to the first embodiment.

FIG. 3 is a plan view of the printed wiring board in a vicinity of the LSI according to the first embodiment of the present invention. The printed wiring board 200 includes a plurality (three) of main power supply patterns 201, 202, and 203 arranged on the surface layer 200a as described above. The main power supply patterns 201 to 203 are applied with three different types of DC voltages (for example, 1.0 V, 1.8 V, and 3.3 V) from the power supply circuit 400.

On the surface layer 200a of this printed wiring board 200, a region opposed to the main body part 310 of the LSI 300 is referred to as a first region R1, and a region other than the first region is referred to as a second region R2. The first region R1 is a projected region of the main body part 310 of the LSI 300 on the surface layer 200a of the printed wiring board 200. Because the main body part 310 is a polygon such as a square in a plan view, the first region R1 is a polygon such as a square.

The main power supply patterns 201, 202, and 203 are wired in the second region R2. Further, as an inner layer of the printed wiring board 200, there is provided a ground layer on which a main ground pattern is formed. It is not always necessary to form the main power supply patterns 201, 202, and 203 on the surface layer of the printed wiring board 200, and it is possible to form the main power supply patterns 201, 202, and 203 on a different wiring layer.

The printed wiring board 200 includes a power supply pattern 211 which is wired to connect the power supply terminals 321 and 322 of the terminal groups 351, 352, and 353 and the power supply terminal 327 on the surface layer 200a. On the surface layer 200a of the printed wiring board 200, there are formed lands $321_1$ and $322_1$ for mounting the power supply terminals 321 and 322 of the terminal group 351 of the LSI 300. Similarly, there are formed lands $321_2$ and $322_2$ for mounting the power supply terminals 321 and 322 of the terminal group 352. There are formed lands $321_3$ and $322_3$ for mounting the power supply terminals 321 and 322 of the terminal group 353. This power supply pattern 211 is a conductor pattern which is electrically connected to the main power supply pattern 201 and connects the lands $321_1$, $322_1$, $321_2$, $322_2$, $321_3$, and $322_3$ in a single stroke manner in this order. Thus, the power supply pattern 211 connects the power supply terminals 321 and 322 of the multiple terminal groups 351, 352, and 353 and the power supply terminal 327 electrically to the main power supply pattern 201.

The printed wiring board 200 includes a power supply pattern 212 which is wired to connect the power supply terminals 323 and 324 of the terminal groups 351, 352, and 353 and the power supply terminal 328 on the surface layer 200a. On the surface layer 200a of the printed wiring board 200, there are formed lands $323_1$ and $324_1$ for mounting the power supply terminals 323 and 324 of the terminal group 351 of the LSI 300. Similarly, there are formed lands $323_2$ and $324_2$ for mounting the power supply terminals 323 and 324 of the terminal group 352. There are formed lands $323_3$ and $324_3$ for mounting the power supply terminals 323 and 324 of the terminal group 353. This power supply pattern 212 is a conductor pattern which is electrically connected to the main power supply pattern 202 and connects the lands $323_1$, $324_1$, $323_2$, $324_2$, $323_3$, and $324_3$ in a single stroke manner in this order. Thus, the power supply pattern 212 connects the power supply terminals 323 and 324 of the multiple terminal groups 351, 352, and 353 and the power supply terminal 328 electrically to the main power supply pattern 202.

The printed wiring board 200 includes a power supply pattern 213 which is wired to connect the power supply terminals 325 and 326 of the terminal groups 351, 352, and 353 and the power supply terminal 329 on the surface layer 200a. On the surface layer 200a of the printed wiring board 200, there are formed lands $325_1$ and $326_1$ for mounting the power supply terminals 325 and 326 of the terminal group 351 of the LSI 300. Similarly, there are formed lands $325_2$ and $326_2$ for mounting the power supply terminals 325 and 326 of the terminal group 352. There are formed lands $325_3$ and $326_3$ for mounting the power supply terminals 325 and 326 of the terminal group 353. This power supply pattern 213 is a conductor pattern which is electrically connected to the main power supply pattern 203 and connects the lands $325_1$, $326_1$, $325_2$, $326_2$, $325_3$, and $326_3$ in a single stroke manner in this order. Thus, the power supply pattern 213 connects the power supply terminals 325 and 326 of the multiple terminal groups 351, 352, and 353 and the power supply terminal 329 electrically to the main power supply pattern 203.

In the first embodiment, the power supply pattern 211 is led from the main power supply pattern 201 (first main power supply pattern) to the first region R1 via a corner part C1 of the first region R1. Then, the power supply pattern 211 connects the power supply terminal 321 and the power supply terminal 322 of the terminal groups 351, 352, and 353 in the second region R2. In other words, the power supply pattern 211 connects the land $321_1$ and the land $322_1$ of a land group corresponding to the terminal group 351, the land $321_2$ and the land $322_2$ of a land group corresponding to the terminal group 352, and the land $321_3$ and the land $322_3$ of a land group corresponding to the terminal group 353 in the second region R2. In addition, the power supply pattern 211 connects the power supply terminal 321 and the power supply terminal 322 provided between two adjacent terminal groups 351 and 352 in the first region R1. In other words, the power supply pattern 211 connects the land $321_1$ of the land group corresponding to the terminal group 351 and the land $322_2$ of the land group corresponding to the terminal group 352 in the first region R1. In addition, the power supply pattern 211 connects the power supply terminal 321 and the power supply terminal 322 of the two adjacent terminal groups 352 and 353 in the first region R1. In other words, the power supply pattern 211 connects the land $321_2$ of the land group corresponding to the terminal group 352 and the land $322_3$ of the land group corresponding to the terminal group 353 in the first region R1. Further, the power supply pattern 211 connects the land $321_3$ of the land group corresponding to the terminal group 353 and a land corresponding to the power supply terminal 327 in the first region R1.

In this case, the power supply pattern 211 is formed so as to connect the main power supply pattern 201 and the power supply terminal 327, and the power supply terminals 321 and 322 of the terminal groups 351, 352, and 353, in a single stroke manner. In other words, the power supply terminals 321, 322, and 327 of the LSI 300 are arranged so that the power supply pattern 211 is formed in a single stroke manner. In the first embodiment, the main power supply pattern 201 and the power supply pattern 211 are formed integrally as a single continuous conductor pattern.

Further, the power supply pattern 212 is wired on an outer perimeter side of the power supply pattern 211 on the surface layer 200a of the printed wiring board 200 when viewed from the center of the LSI 300. The power supply pattern 212 is led from the main power supply pattern 202 to the first region R1 via the corner part C1 of the first region R1. Then, the power supply pattern 212 connects the power supply terminal 323 and the power supply terminal 324 of the terminal groups 351, 352, and 353 so as to cross the power supply terminals 321 and 322 in the second region R2. In other words, the power supply pattern 212 connects a land $323_1$ and a land $324_2$ corresponding to the terminal group 351, a land $323_2$ and a land $324_2$ corresponding to the terminal group 352, and a land $323_3$ and a land $324_3$ corresponding to the terminal group 353 in the second region R2. In addition, the power supply pattern 212 connects the power supply terminal 323 and the power supply terminal 324 provided between the two adjacent terminal groups 351 and 352 in the first region R1. In other words, the power supply pattern 212 connects the land $323_2$ of the land group corresponding to the terminal group 351 and the land $324_2$ of the land group corresponding to the terminal group 352 in the first region R1. In addition, the power supply pattern 212 connects the power supply terminal 323 and the power supply terminal 324 of the two adjacent terminal groups 352 and 353 in the first region R1. In other words, the power supply pattern 212 connects the land $323_2$ of the land group corresponding to the terminal group 352 and the land $324_3$ of the land group corresponding to the terminal group 353 in the first region R1. Further, the power supply pattern 212 connects the land $323_3$ of the land group corresponding to the terminal group 353 and the power supply terminal 328 in the first region R1.

In this case, the power supply pattern 212 is formed so as to connect the power supply terminals 323 and 324 of the terminal groups 351, 352, and 353 from the main power supply pattern 202 (second main power supply pattern) to the power supply terminal 328 in a single stroke manner. In other words, the power supply terminals 323, 324, and 328 of the LSI 300 are arranged so that the power supply pattern 212 is formed in a single stroke manner. In the first embodiment, the main power supply pattern 202 and the power supply pattern 212 are formed integrally as a single continuous conductor pattern.

In addition, the power supply pattern 213 is wired on an outer perimeter side of the power supply pattern 212 on the surface layer 200a of the printed wiring board 200 when viewed from the center of the LSI 300. The power supply pattern 213 is led from the main power supply pattern 203 to the first region R1 via the corner part C1 of the first region R1. Then, the power supply pattern 213 connects the power supply terminal 325 and the power supply terminal 326 of the terminal groups 351, 352, and 353 so as to cross the power supply terminals 323 and 324 (and power supply terminals 321 and 322) in the second region R2. In other words, the power supply pattern 213 connects the land $325_2$ and the land $326_2$ corresponding to the terminal group 351, the land $325_2$ and the land $326_2$ corresponding to the terminal group 352, and the land $325_3$ and the land $326_3$ corresponding to the terminal group 353 in the second region R2. In addition, the power supply pattern 213 connects the power supply terminal 325 and the power supply terminal 326 provided between the two adjacent terminal groups 351 and 352 in the first region R1. In other words, the power supply pattern 213 connects the land $325_1$ of the land group corresponding to the terminal group 351 and the land $326_2$ of the land group corresponding to the terminal group 352 in the first region R1. In addition, the power supply pattern 213 connects the power supply terminal 325 and the power supply terminal 326 of the two adjacent terminal groups 352 and 353 in the first region R1. In other words, the power supply pattern 213 connects the land $325_2$ of the land group corresponding to the terminal group 352 and the land $326_3$ of the land group corresponding to the terminal group 353 in the first region R1. Further, the power supply pattern 213 connects the land $325_3$ of the land group corresponding to the terminal group 353 and the power supply terminal 329 in the first region R1.

In this case, the power supply pattern 213 is formed so as to connect the main power supply pattern 203 (third main power supply pattern) and the power supply terminal 329 in such a way that the power supply terminals 325 and 326 of the terminal groups 351 and 352 are connected in a single stroke manner. In other words, the power supply terminals 325, 326, and 329 of the LSI 300 are arranged so that the power supply pattern 213 is formed in a single stroke manner. In the first embodiment, the main power supply pattern 203 and the power supply pattern 213 are formed integrally as a single continuous conductor pattern.

As described above, the multiple main power supply patterns 201 to 203 and the multiple power supply patterns 211 to 213 are formed on the same surface layer 200a without crossing each other. Thus, the power supply layer as the inner layer of the printed wiring board 200 can be eliminated, and hence the number of layers of the printed wiring board 200 can be reduced.

Although not illustrated in the first embodiment, a decoupling capacitor is disposed between a ground pattern (not shown) and each of the power supply terminals 321 to 326 of the terminal groups 351 to 353 and the power supply terminals 327 to 329.

Figure 4:
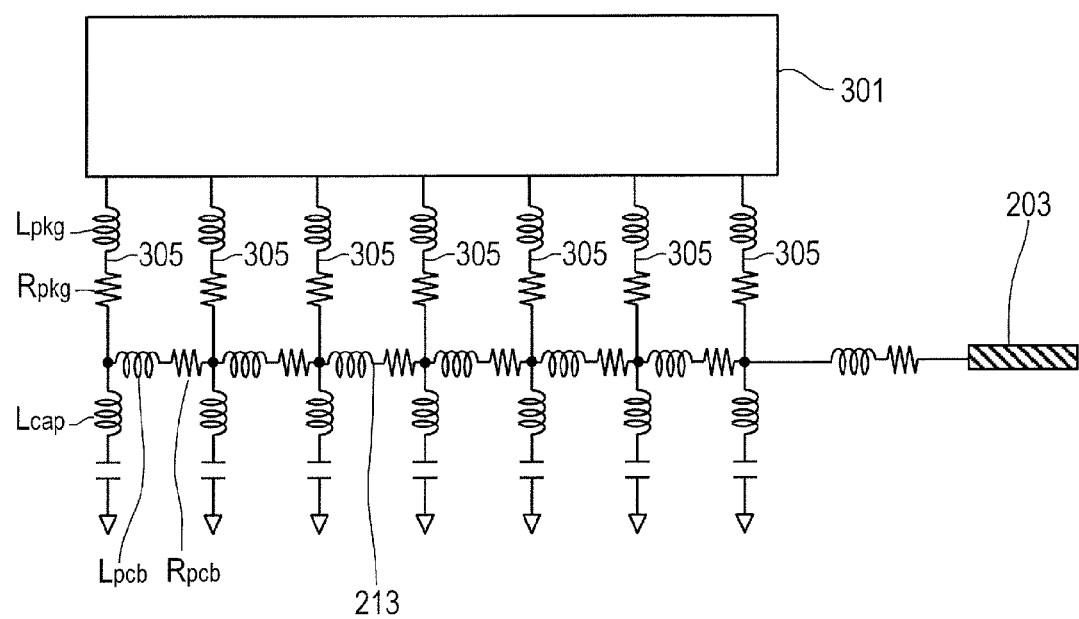
FIG. 4 is an equivalent circuit diagram of the printed circuit board according to the first embodiment.

FIG. 4 illustrates an equivalent circuit of one power supply wiring of the printed circuit board according to the first embodiment of the present invention. Here, $R_{pkg}$ represents a parasitic resistance of the metal wire 305, $L_{pkg}$ represents a parasitic inductance of the metal wire 305, $R_{pcb}$ represents a parasitic resistance of the power supply pattern 213, and $L_{pcb}$ represents a parasitic inductance of the power supply pattern 213. In addition, $L_{cap}$ represents a parasitic inductance of the decoupling capacitor (not shown). In addition, I represents a current flowing through the metal wire 305.

When $\Delta V$ represents a power supply voltage fluctuation, $\Delta V=(R_{pcb}+R_{pkg})\times I+(L_{cap}+L_{pkg})\times dI/dt$ is established. The impedance, namely $R_{pkg}$, $L_{cap}$, and $L_{pkg}$ can be reduced by a parallel effect obtained by connecting the multiple metal wires 305 of the LSI 300 to the power supply pattern 213 at multiple points. Thus, the power supply voltage fluctuation $\Delta V$ can be reduced. Because the resistance $R_{pcb}$ is smaller than the resistance $R_{pkg}$ and has a smaller contribution, the resistance $R_{pcb}$ has little influence on the power supply voltage fluctuation $\Delta V$.

In addition, radiation noise EMI is proportional to $L_{cap}/L_{pcb}\times I$. Because $L_{cap}$ can be reduced by the parallel effect, the radiation noise EMI can be reduced. Further, $L_{pcb}$ can be adjusted by a wiring width or a wiring length of the power supply pattern 213. Specifically, as the power supply pattern 213 is thinner and longer, inductance for a high frequency current can be increased. In other words, decoupling effect for a high frequency current can be obtained.

Although the power supply pattern 213 is described above, the same description can be applied to the power supply patterns 211 and 212.

As described above, in the first embodiment, the power supply potential fluctuation is reduced and the radiation noise is suppressed, while the main power supply patterns 201 to 203 and the power supply patterns 211 to 213 can be wired on the surface layer 200a. Therefore, the number of layers of the printed wiring board 200 can be reduced.

Second Embodiment

Figure 5:
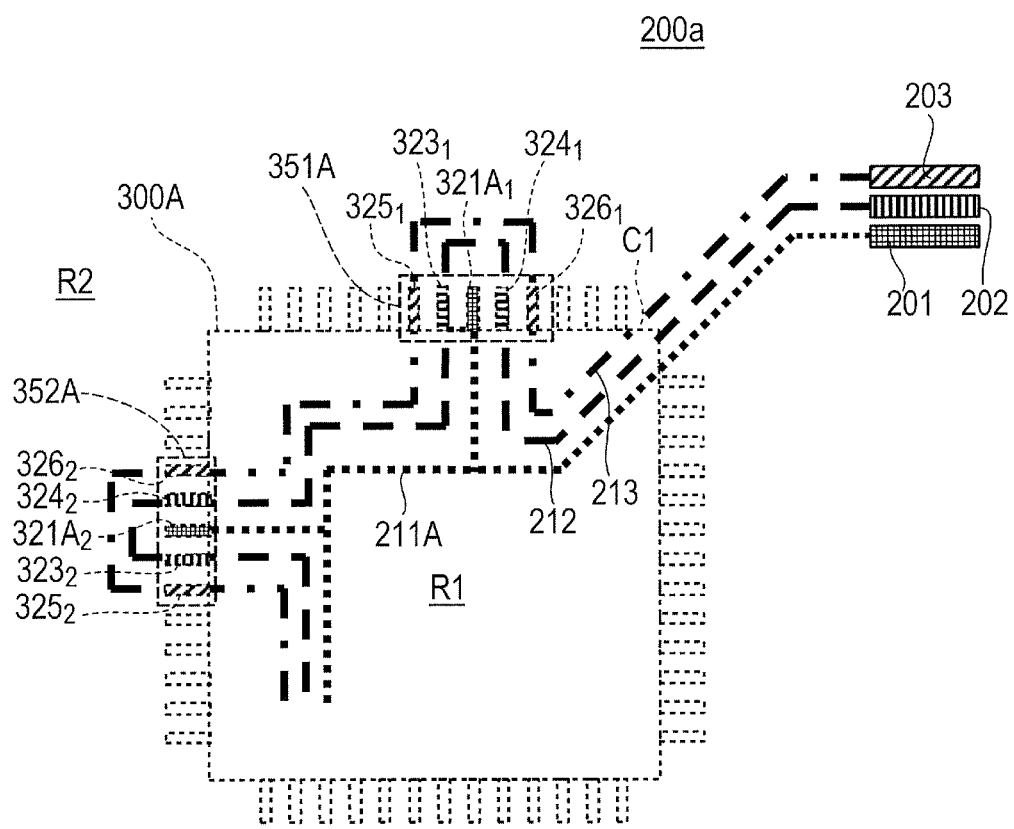
FIG. 5 is a plan view of a printed wiring board in a vicinity of the LSI according to a second embodiment of the present invention.

Next, a printed circuit board according to a second embodiment of the present invention is described. FIG. 5 is a plan view of the printed wiring board in a vicinity of the LSI according to the second embodiment of the present invention. In the second embodiment, the same structure as that of the first embodiment is denoted by the same numeral or symbol so that overlapping description is omitted.

In the first embodiment, there is described the case where the first power supply pattern 211 is formed in a single stroke manner as illustrated in FIG. 3. However, the present invention is not limited thereto, and as illustrated in FIG. 5, a power supply pattern 211A may not be formed in a single stroke manner.

In the second embodiment, an LSI 300A includes two terminal groups 351A and 352A as the multiple terminal groups. The terminal group 351A includes one power supply terminal 321A applied with a DC voltage different from those applied to the other power supply terminals 323 to 326. The terminal group 352A includes one power supply terminal 321A applied with a DC voltage different from those applied to the other power supply terminals 323 to 326. In FIG. 5, the land for mounting the power supply terminal 321 of the terminal group 351A is $321A_1$, and the land for mounting the power supply terminal 321 of the terminal group 352A is $321A_2$. In the second embodiment, the number of the first power supply terminals is reduced to be smaller than that of the first embodiment.

The power supply pattern 211A is led from the first main power supply pattern 201 to the first region R1 on the surface layer 200a and is wired to connect the power supply terminals 321A of the terminal groups 351A and 352A. In the second embodiment, the power supply pattern 211A is wired to branch to the individual power supply terminals 321A in the first region R1. With this power supply pattern 211A, the power supply terminals 321A of the multiple terminal groups 351A and 352A are electrically connected to the main power supply pattern 201.

As described above, also in the second embodiment, the power supply potential fluctuation is reduced and the radiation noise is suppressed, while the main power supply patterns 201 to 203 and the power supply patterns 211A to 213 can be wired on the surface layer 200a. Therefore, the number of layers of the printed wiring board can be reduced.

Third Embodiment

Figure 6:
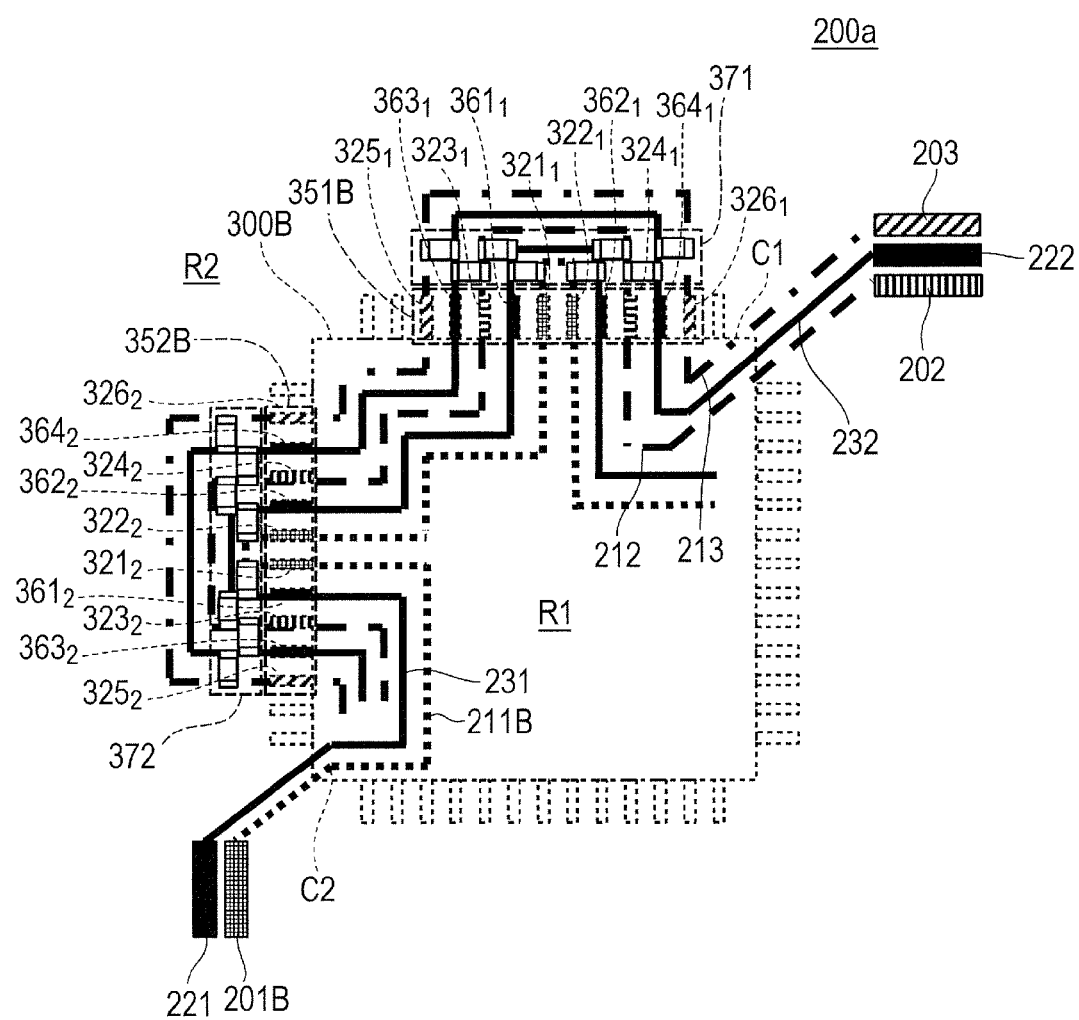
FIG. 6 is a plan view of a printed wiring board in a vicinity of the LSI according to a third embodiment of the present invention.

Next, a printed circuit board according to a third embodiment of the present invention is described. FIG. 6 is a plan view of the printed wiring board in a vicinity of the LSI according to the third embodiment of the present invention. In the third embodiment, the same structure as that of the first and second embodiments is denoted by the same numeral or symbol so that overlapping description is omitted.

In the first embodiment, there is described the case where the power supply patterns 211 to 213 are wired via one corner part C1 of the first region R1 as illustrated in FIG. 3. However, the power supply patterns 211 to 213 may be wired via any one of the multiple corner parts.

In the third embodiment, as illustrated in FIG. 6, the printed wiring board includes first to third main power supply patterns 201B, 202, and 203 which are arranged in the second region R2 on the surface layer 200a and are applied with different DC voltages from the power supply circuit. The first main power supply pattern 201B is wired to extend to a vicinity of a corner part C2 of the first region R1. The second main power supply pattern 202 and the third main power supply pattern 203 are wired to extend to a vicinity of the corner part C1 different from the corner part C2 of the first region R1. Then, a power supply pattern 211B is led from the main power supply pattern 201B to the first region R1 via the corner part C2 of the first region R1. In addition, the power supply patterns 212 and 213 are led from the main power supply patterns 202 and 203 to the first region R1 via the corner part C1 of the first region R1. In other words, the first power supply pattern and the second power supply pattern are wired via different corner parts C1 and C2, respectively.

In this way, the power supply patterns 212 and 213 are wired in the direction to approach from the main power supply patterns 202 and 203 to the first region R1, and the power supply pattern 211B is wired in the direction to approach from the main power supply pattern 201B to the first region R1. The power supply pattern 211B and the power supply patterns 212 and 213 have different approaching directions and thus are supplied with power from two directions. Although the approaching directions are two directions in the third embodiment in order to simplify the description, the approaching directions may be three or more directions.

In addition, in the first embodiment, there is described the case where the main ground pattern is disposed on the inner layer. In the third embodiment, the printed wiring board includes main ground patterns 221 and 222 disposed in the second region R2 on the surface layer 200a. The main ground patterns 221 and 222 are conductor patterns connected to the ground terminal of the power supply circuit.

In the third embodiment, the main ground pattern 221 is wired to extend from the power supply circuit to a vicinity of the corner part C2 of the first region R1, and the main ground pattern 222 is wired to extend from the power supply circuit to a vicinity of the corner part C1 different from the corner part C2 of the first region R1.

An LSI 300B includes two terminal groups 351B and 352B as the multiple terminal groups, and the terminal groups 351B and 352B have the power supply terminals 321 to 326 similarly to the first embodiment. Further, in the third embodiment, the terminal group 351B includes ground terminals 361 to 364, and the terminal group 352B includes the ground terminals 361 to 364.

The first ground terminal 361 is disposed between the first power supply terminal 321 and the third power supply terminal 323, while the second ground terminal 362 is disposed between the second power supply terminal 322 and the fourth power supply terminal 324. In addition, the third ground terminal 363 is disposed between the third power supply terminal 323 and the fifth power supply terminal 325, while the fourth ground terminal 364 is disposed between the fourth power supply terminal 324 and the sixth power supply terminal 326.

The printed wiring board includes a ground pattern 231 which is wired to connect a land $361_1$ to which the ground terminal 361 of the terminal group 351B is mounted, a land $362_1$ to which the ground terminal 362 of the terminal group 351B is mounted, a land $361_2$ to which the ground terminal 361 of the terminal group 352B is mounted, and a land $362_2$ to which the ground terminal 362 of the terminal group 352B is mounted on the surface layer 200a. This ground pattern 231 is a conductor pattern which is electrically connected to the main ground pattern 221. The ground terminals 361 and 362 of the multiple terminal groups 351B and 352B are electrically connected to the main ground pattern 221 by the ground pattern 231.

In addition, the printed wiring board includes a ground pattern 232 which is wired to connect a land $363_1$ to which the ground terminal 363 of the terminal group 351B is mounted, a land $364_2$ to which the ground terminal 364 of the terminal group 351B is mounted, a land $363_2$ to which the ground terminal 363 of the terminal group 352B is mounted, and a land $364_2$ to which the ground terminal 364 of the terminal group 352B is mounted on the surface layer 200a. This ground pattern 232 is a conductor pattern which is electrically connected to the main ground pattern 222. The ground terminals 363 and 364 of the multiple terminal groups 351B and 352B are electrically connected to the main ground pattern 222 by the ground pattern 232.

In the third embodiment, the ground pattern 231 is wired between the power supply pattern 211B and the power supply pattern 212. The ground pattern 231 is led from the main ground pattern 221 to the first region R1 via the corner part C2 of the first region R1. Then, the ground pattern 231 connects the ground terminal 361 and the ground terminal 362 of the terminal groups 351B and 352B in the second region R2, while crossing the power supply terminals 321 and 322. In other words, the ground pattern 231 connects the land $361_2$ to which the ground terminal 361 of the terminal group 351B is mounted, the land $362_2$ to which the ground terminal 362 of the terminal group 351B is mounted, the land $361_2$ to which the ground terminal 361 of the terminal group 352B is mounted, and the land $362_2$ to which the ground terminal 362 of the terminal group 352B is mounted in the second region R2. In addition, the ground pattern 231 connects the ground terminal 361 and the ground terminal 362 provided between the two adjacent terminal groups 351B and 352B in the first region R1. In other words, the ground pattern 231 connects the land $361_1$ to which the ground terminal 361 of the terminal group 351B is mounted and the land $362_2$ to which the ground terminal 362 of the terminal group 352B is mounted in the first region R1.

In this way, in the third embodiment, the ground pattern 231 is formed to connect the main ground pattern 221 and the ground terminals 361 and 362 of the terminal groups 351B and 352B in a single stroke manner. In other words, the ground terminals 361 and 362 of the LSI 300B are arranged so that the ground pattern 231 is formed in a single stroke manner. Further, in the third embodiment, the main ground pattern 221 and the ground pattern 231 are integrally formed as a single continuous conductor pattern.

In addition, the ground pattern 232 is wired between the power supply pattern 212 and the power supply pattern 213. The ground pattern 232 is led from the main ground pattern 222 to the first region R1 via the corner part C1 of the first region R1. Then, the ground pattern 232 connects the ground terminal 363 and the ground terminal 364 of the terminal groups 351B and 352B in the second region R2, while crossing the power supply terminals 323 and 324 (and the power supply terminals 321 and 322 and the ground terminals 361 and 362). In other words, the ground pattern 232 connects the land $363_1$ and the land $364_1$ of the terminal group 351B and the land $363_2$ and the land $364_2$ of the terminal group 352B in the second region R2. In addition, the ground pattern 232 connects the ground terminal 363 and the ground terminal 364 provided between the two adjacent terminal groups 351B and 352B in the first region R1. In other words, the ground pattern 232 connects the land $363_1$ to which the ground terminal 363 of the terminal group 351B is mounted and the land $364_2$ to which the ground terminal 364 of the terminal group 352B is mounted in the first region R1.

As described above, in the third embodiment, the ground pattern 232 is formed so as to connect the main ground pattern 222 and the ground terminals 363 and 364 of the terminal groups 351B and 352B in a single stroke manner. In other words, the ground terminals 363 and 364 of the LSI 300B are arranged so that the ground pattern 232 is formed in a single stroke manner. In the third embodiment, the main ground pattern 222 and the ground pattern 232 are formed integrally as a single continuous conductor pattern.

In the third embodiment, a capacitor group 371 and a capacitor group 372 including multiple capacitors connected between the power supply patterns 211B, 212, and 213 and the ground patterns 231 and 232 are mounted in the second region R2. Specifically, in the terminal groups 351B and 352B, the capacitors are connected between the power supply terminal 321 and the ground terminal 361, between the power supply terminal 322 and the ground terminal 362, and between the power supply terminal 323 and the ground terminal 361. In addition, in the terminal groups 351B and 352B, the capacitors are connected between the power supply terminal 324 and the ground terminal 362, between the power supply terminal 323 and the ground terminal 363, and between the power supply terminal 324 and the ground terminal 364. In addition, the capacitors are connected between the power supply terminal 325 and the ground terminal 363, and between the power supply terminal 326 and the ground terminal 364. In order to simplify the description, the two capacitor groups 371 and 372 are provided in the third embodiment, but there may be two or more capacitor groups.

As described above, the main ground patterns 221 and 222 and the ground patterns 231 and 232 are disposed on the same surface layer 200a without crossing each other. Thus, the ground layer as the inner layer of the printed wiring board can be eliminated, and hence the number of layers of the printed wiring board can be reduced.

In particular, in the third embodiment, because the power supply wirings 201B to 203 and 211B to 213, the ground wirings 221, 222, 231, and 232, and the signal wiring (not shown) are disposed on the surface layer 200a, the printed wiring board can be a single-sided board having a single layer.

In addition, the capacitor groups 371 and 372 can be disposed in a vicinity of the power supply terminal of the LSI 300B, and hence a potential fluctuation suppression effect due to transient current sink of the LSI 300B can be improved. As described above, in addition to the effect of the first embodiment, it is possible to further improve the potential fluctuation suppression effect.

Fourth Embodiment

Figure 7:
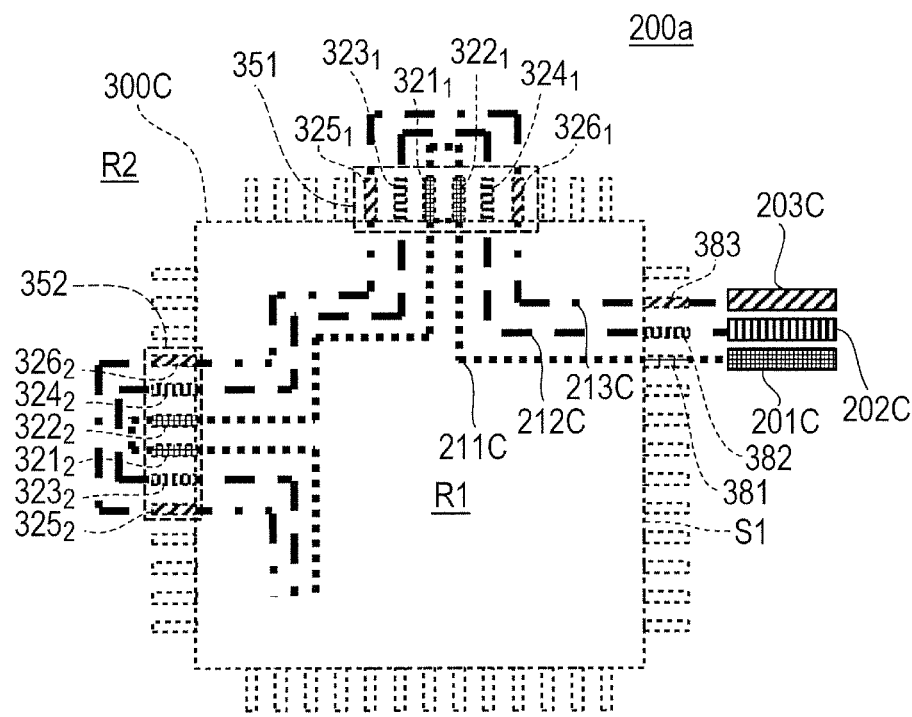
FIG. 7 is a plan view of a printed wiring board in a vicinity of the LSI according to a fourth embodiment of the present invention.

Next, a printed circuit board according to a fourth embodiment of the present invention is described. FIG. 7 is a plan view of the printed wiring board in a vicinity of the LSI according to the fourth embodiment of the present invention. In the fourth embodiment, the same structure as that of the first to third embodiments is denoted by the same numeral or symbol so that overlapping description is omitted.

In the first embodiment, there is described the case where the power supply patterns 211 to 213 are wired via the corner part C1 of the first region R1 as illustrated in FIG. 3. In the fourth embodiment, there is described a case where power supply patterns 211C to 213C are wired via a side S1 of the first region R1 as illustrated in FIG. 7.

In the fourth embodiment, the printed wiring board includes a first main power supply pattern 201C, a second main power supply pattern 202C, and a third main power supply pattern 203C, which are disposed in the second region R2 on the surface layer 200a. The main power supply patterns 201C, 202C, and 203C are wired to extend from the power supply circuit to a vicinity of the side S1 of the first region R1. The main power supply patterns 201C, 202C, and 203C are applied with different DC voltages from the power supply circuit.

An LSI 300C includes three power supply terminals 381 to 383 other than the terminal group, which are electrically connected to the semiconductor element and protrude externally from the main body part. The power supply terminals 381 to 383 are electrically connected to the main power supply patterns 201C, 202C, and 203C and are supplied with different DC voltages from the main power supply patterns 201C, 202C, and 203C.

The printed wiring board includes a first power supply pattern 211C which is wired to connect the first power supply terminal 321 and the second power supply terminal 322 of the terminal groups 351—and 352 on the surface layer 200a. This power supply pattern 211C is a conductor pattern which is electrically connected to the main power supply pattern 201C, and the power supply terminals 321 and 322 of the multiple terminal groups 351 and 352 are electrically connected to the main power supply pattern 201C by the power supply pattern 211C.

This power supply pattern 211C is led from the main power supply pattern 201C to the first region R1 via the side S1 of the first region R1. In this case, the power supply pattern 211C is electrically connected to the power supply terminal 381. In this way, the power supply pattern 211C is led to the first region R1 via the power supply terminal 381. Therefore, it is not necessary to change the inter-terminal distance for wiring the power supply pattern 211C. Further, a connection structure of the power supply pattern 211C in the terminal groups 351 and 352 and a connection structure of the power supply pattern 211C between the terminal groups are the same as those of the power supply pattern 211 in the first embodiment.

In addition, the printed wiring board includes a second power supply pattern 212C which is wired to connect the land $323_1$ to which the third power supply terminal 323 of the terminal group 351 is mounted, the land $324_1$ to which the fourth power supply terminal 324 of the terminal group 351 is mounted, the land $323_2$ to which the third power supply terminal 323 of the terminal group 352 is mounted, and the land $324_2$ to which the fourth power supply terminal 324 of the terminal group 352 is mounted on the surface layer 200a. This power supply pattern 212C is a conductor pattern which is electrically connected to the main ground pattern 202C, and the power supply terminals 323 and 324 of the multiple terminal groups 351 and 352 are electrically connected to the main power supply pattern 202C by the power supply pattern 212C.

This power supply pattern 212C is led from the main power supply pattern 202C to the first region R1 via the side S1 of the first region R1. In this case, the power supply pattern 212C is electrically connected to the power supply terminal 382. In this way, the power supply pattern 212C is led to the first region R1 via the power supply terminal 382. Therefore, it is not necessary to change the inter-terminal distance for wiring the power supply pattern 212C. Further, a connection structure of the power supply pattern 212C in the terminal groups 351 and 352 and a connection structure of the power supply pattern 212C between the terminal groups are the same as those of the power supply pattern 212 in the first embodiment.

In addition, the printed wiring board includes a third power supply pattern 213C which is wired to connect the land $325_1$ to which the fifth power supply terminal 325 of the terminal group 351 is mounted, the land $326_1$ to which the sixth power supply terminal 326 of the terminal group 351 is mounted, the land $325_2$ to which the fifth power supply terminal 325 of the terminal group 352 is mounted, and the land $326_2$ to which the sixth power supply terminal 326 of the terminal group 352 is mounted on the surface layer 200a. This power supply pattern 213C is a conductor pattern which is electrically connected to the main power supply pattern 203C, and the power supply terminals 325 and 326 of the multiple terminal groups 351 and 352 are electrically connected to the main power supply pattern 203C by the power supply pattern 213C.

This power supply pattern 213C is led from the main power supply pattern 203C to the first region R1 via the side S1 of the first region R1. In this case, the power supply pattern 213C is electrically connected to the power supply terminal 383. In this way, the power supply pattern 213C is led to the first region R1 via the power supply terminal 383. Therefore, it is not necessary to change the inter-terminal distance for wiring the power supply pattern 213C. Further, a connection structure of the power supply pattern 213C in the terminal groups 351 and 352 and a connection structure of the power supply pattern 213C between the terminal groups are the same as those of the power supply pattern 213 in the first embodiment.

In the fourth embodiment, the power supply pattern 211C is formed to connect the main power supply pattern 201C and the power supply terminals 321 and 322 of the terminal groups 351 and 352 in a single stroke manner. In other words, the power supply terminals 321 and 322 of the LSI 300C are arranged so that the power supply pattern 211C is formed in a single stroke manner.

In addition, the power supply pattern 212C is formed to connect the main power supply pattern 202C and the power supply terminals 323 and 324 of the terminal groups 351 and 352 in a single stroke manner. In other words, the power supply terminals 323 and 324 of the LSI 300C are arranged so that the power supply pattern 212C is formed in a single stroke manner.

In addition, the power supply pattern 213C is formed to connect the main power supply pattern 203C and the power supply terminals 325 and 326 of the terminal groups 351 and 352 in a single stroke manner. In other words, the power supply terminals 325 and 326 of the LSI 300C are arranged so that the power supply pattern 213C is formed in a single stroke manner.

In the fourth embodiment, the main power supply pattern 201C and the power supply pattern 211C are integrally formed as a single continuous conductor pattern. Similarly, the main power supply pattern 202C and the power supply pattern 212C are integrally formed as a single continuous conductor pattern, and the main power supply pattern 203C and the power supply pattern 213C are integrally formed as a single continuous conductor pattern.

As described above, in the fourth embodiment, the power supply potential fluctuation is reduced and the radiation noise is suppressed, while the main power supply patterns 201C to 203C and the power supply patterns 211C to 213C can be wired on the surface layer 200a. Therefore, the number of layers of the printed wiring board can be reduced.

Fifth Embodiment

Figure 8:
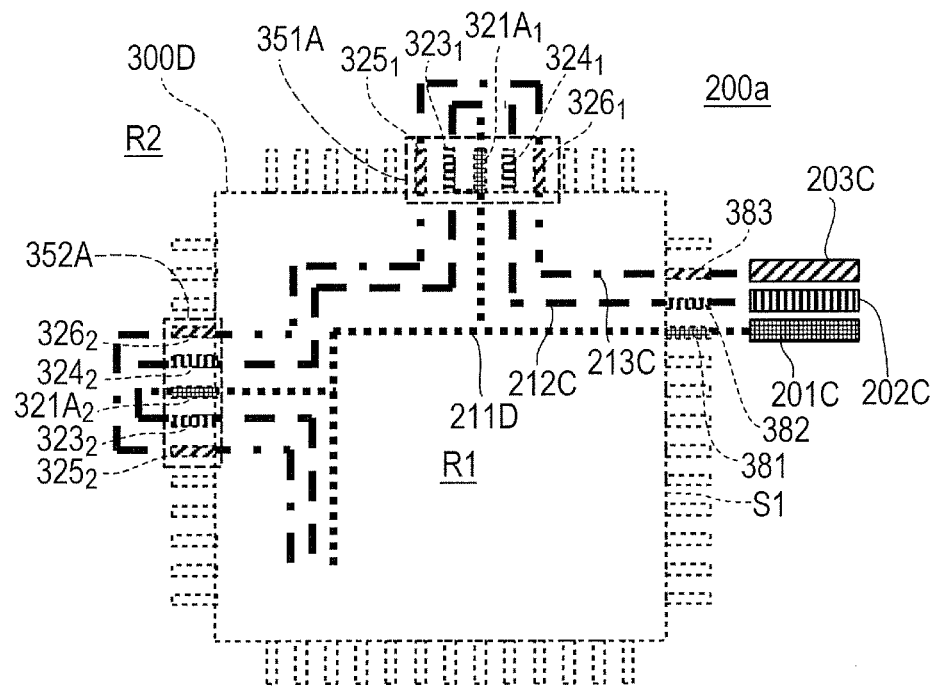
FIG. 8 is a plan view of a printed wiring board in a vicinity of the LSI according to a fifth embodiment of the present invention.

Next, a printed circuit board according to a fifth embodiment of the present invention is described. FIG. 8 is a plan view of the printed wiring board in a vicinity of the LSI according to the fifth embodiment of the present invention. In the fifth embodiment, the same structure as that of the first to fourth embodiments is denoted by the same numeral or symbol so that overlapping description is omitted.

In the fourth embodiment, there is described the case where the power supply pattern 211C is formed in a single stroke manner as illustrated in FIG. 7. However, the present invention is not limited thereto, and as illustrated in FIG. 8, a power supply pattern 211D may not be formed in a single stroke manner.

In the fifth embodiment, an LSI 300D includes the two terminal groups 351A and 352A as the multiple terminal groups. The terminal groups 351A and 352A of the LSI 300D each include one power supply terminal 321A which is applied with a DC voltage different from that applied to the other power supply terminals 323 to 326. Here, when the power supply terminal 321A is the first power supply terminal, the number of first power supply terminals is reduced to be smaller in the fifth embodiment than that in the fourth embodiment.

The power supply pattern 211D is led from the main power supply pattern 201C to the first region R1 on the surface layer 200a and is wired to connect the power supply terminals 321A of the terminal groups 351A and 352A. In the fifth embodiment, the power supply pattern 211D is wired to branch to the individual power supply terminals 321A in the first region R1. With this power supply pattern 211D, the power supply terminals 321A of the multiple terminal groups 351A and 352A are electrically connected to the main power supply pattern 201C.

As described above, also in the fifth embodiment, the power supply potential fluctuation is reduced and the radiation noise is suppressed, while the first to third main power supply patterns 201C to 203C and the first to third power supply patterns 211D to 213C can be wired on the surface layer 200a. Therefore, the number of layers of the printed wiring board can be reduced.

Sixth Embodiment

Figure 9:
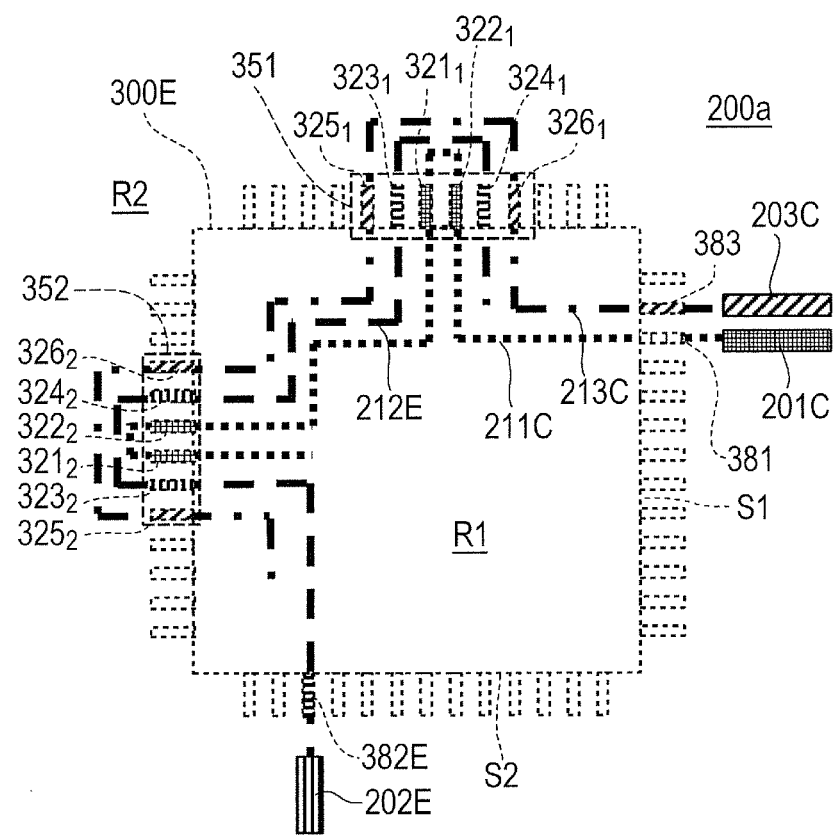
FIG. 9 is a plan view of a printed wiring board in a vicinity of the LSI according to a sixth embodiment of the present invention.

Next, a printed circuit board according to a sixth embodiment of the present invention is described. FIG. 9 is a plan view of the printed wiring board in a vicinity of the LSI according to the sixth embodiment of the present invention. In the sixth embodiment, the same structure as that of the first to fifth embodiments is denoted by the same numeral or symbol so that overlapping description is omitted.

In the fourth embodiment, as illustrated in FIG. 7, there is described the case where the first to third power supply patterns 211C to 213C are wired via the side S1 of the first region R1. However, the first to third power supply patterns 211C to 213C may be wired via any one of multiple sides of the first region R1.

In the sixth embodiment, the printed wiring board includes first, second, and third main power supply patterns 201C, 202E, and 203C disposed in the second region R2 on the surface layer 200a. The main power supply patterns 201C and 203C are wired to extend from the power supply circuit to a vicinity of the side S1 of the first region R1. Further, the main power supply pattern 202E is wired to extend from the power supply circuit to a vicinity of a side S2 of the first region R1, which is different from the side S1 of the first region R1. The main power supply patterns 201C, 202E, and 203C are applied with different DC voltages from the power supply circuit.

An LSI 300E includes three power supply terminals 381, 382E, and 383 which are electrically connected to the semiconductor element and protrude externally from the main body part.

The power supply terminals 381, 382E, and 383 are electrically connected to the first, second, and third main power supply patterns 201C, 202E, and 203C and are supplied with different DC voltages from the main power supply patterns 201C, 202E, and 203C.

The printed wiring board includes a power supply pattern 212E which is wired to connect the lands $323_1$ and $324_1$ of a land group corresponding to the terminal group 351 and the lands $323_2$ and $324_2$ of a land group corresponding to the terminal group 352 on the surface layer 200a. This power supply pattern 212E is a conductor pattern which is electrically connected to the main power supply pattern 202E, and the power supply terminals 323 and 324 of the multiple terminal groups 351 and 352 are electrically connected to the main power supply pattern 202E by the power supply pattern 212E.

This power supply pattern 212E is led from the main power supply pattern 202E to the first region R1 via the side S2 of the first region R1, which is different from the side S1. In this case, the power supply pattern 212E is electrically connected to the power supply terminal 382E. In this way, the power supply pattern 212E is led to the first region R1 via the power supply terminal 382E. Therefore, it is not necessary to change the inter-terminal distance for wiring the power supply pattern 212E. Further, a connection structure of the power supply pattern 212E in the terminal groups 351 and 352 and a connection structure of the power supply pattern 212E between the terminal groups are the same as those of the power supply pattern 212C in the fourth embodiment.

In this way, the direction in which the power supply patterns 211C and 213C approach from the main power supply patterns 201C and 203C to the first region R1 is different from the direction in which the power supply pattern 212E approaches from the main power supply pattern 202E to the first region R1, and hence power is supplied in the two directions. In order to simplify the description, the two directions are exemplified as the approaching direction in the sixth embodiment, but three or more directions may be used.

As described above, in the sixth embodiment, the power supply potential fluctuation is reduced and the radiation noise is suppressed, while the main power supply patterns 201C, 202E, and 203C and the power supply patterns 211C, 212E, and 213C can be wired on the surface layer 200a. Therefore, the number of layers of the printed wiring board can be reduced.

Seventh Embodiment

Figure 10:
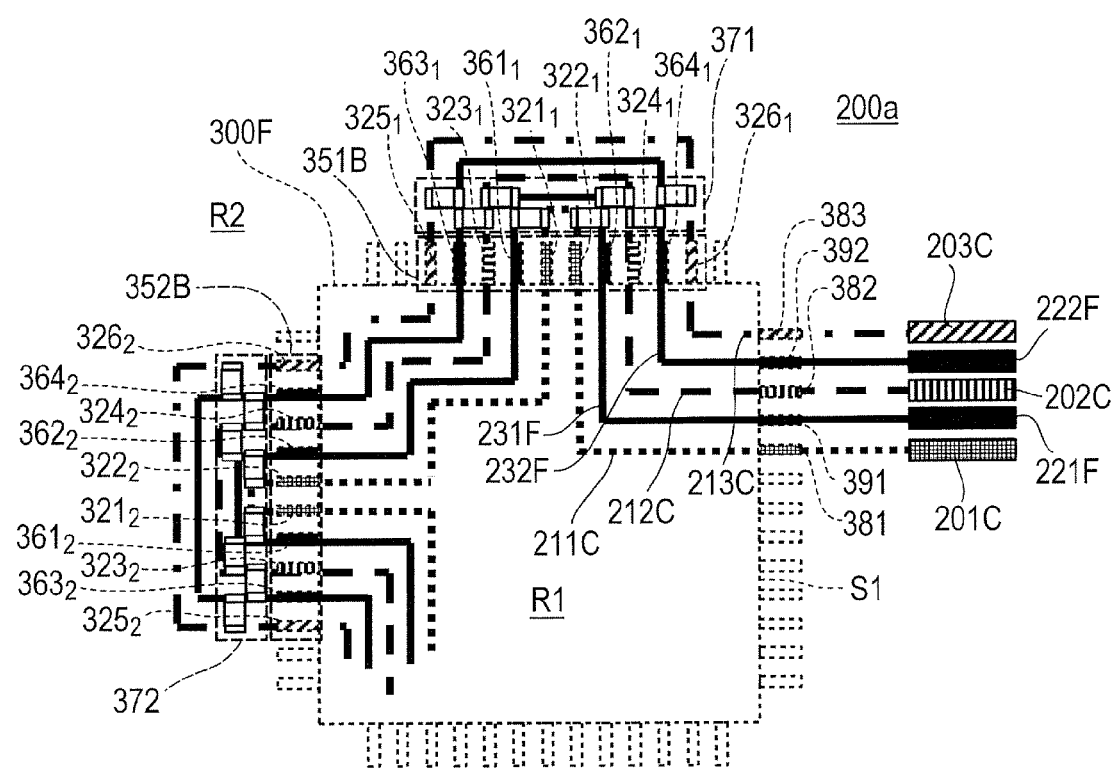
FIG. 10 is a plan view of a printed wiring board in a vicinity of the LSI according to a seventh embodiment of the present invention.

Next, a printed circuit board according to a seventh embodiment of the present invention is described. FIG. 10 is a plan view of the printed wiring board in a vicinity of the LSI according to the seventh embodiment of the present invention. In the seventh embodiment, the same structure as that of the first to sixth embodiments is denoted by the same numeral or symbol so that overlapping description is omitted.

In the sixth embodiment, there is described the case where the main ground pattern is disposed on the inner layer. In the seventh embodiment, the printed wiring board includes main ground patterns 221F and 222F disposed in the second region R2 on the surface layer 200a. The main ground patterns 221F and 222F are conductor patterns connected to the ground terminal of the power supply circuit.

In the seventh embodiment, the main ground patterns 221F and 222F are wired to extend from the power supply circuit to a vicinity of the side S1 of the first region R1.

An LSI 300F includes the two terminal groups 351B and 352B as the multiple terminal groups. The terminal groups 351B and 352B each include the power supply terminals 321 to 326 and the ground terminals 361 to 364 similarly to the sixth embodiment. In addition, in the seventh embodiment, the LSI 300F includes the three power supply terminals 381 to 383 as well as two ground terminals 391 and 392 other than the terminal group, which are electrically connected to the semiconductor element and protrude externally from the main body part.

The ground terminal 391 is disposed between the power supply terminal 381 and the power supply terminal 382, while the ground terminal 392 is disposed between the power supply terminal 382 and the power supply terminal 383.

The printed wiring board includes a ground pattern 231F which is wired to connect the land $361_1$ to which the ground terminal 361 of the terminal group 351B is mounted, the land $362_1$ to which the ground terminal 362 is mounted, the land $361_2$ to which the ground terminal 361 of the terminal group 352B is mounted, the land $362_2$ to which the ground terminal 362 is mounted, and a land to which the ground terminal 391 is mounted on the surface layer 200a. This ground pattern 231F is a conductor pattern which is electrically connected to the main ground pattern 221F. The ground terminal 391 and the ground terminals 361 and 362 of the multiple terminal groups 351B and 352B are electrically connected to the main ground pattern 221F by the ground pattern 231F.

This ground pattern 231F is led from the main ground pattern 221F to the first region R1 via the side S1 of the first region R1. In this case, the ground pattern 231F is electrically connected to the ground terminal 391. In this way, the ground pattern 231F is led to the first region R1 via the ground terminal 391. Therefore, it is not necessary to change the inter-terminal distance for wiring the ground pattern 231F. Further, a connection structure of the ground pattern 231F in the terminal groups 351B and 352B and a connection structure of the ground pattern 231F between the terminal groups are the same as those of the ground pattern 231 in the third embodiment.

In addition, the printed wiring board includes a ground pattern 232F which is wired to connect the land $363_1$ to which the ground terminal 363 of the terminal group 351B is mounted, the land $364_1$ to which the ground terminal 364 of the terminal group 351B is mounted, the land $363_2$ to which the ground terminal 363 of the terminal group 352B is mounted, and the land $364_2$ to which the ground terminal 364 of the terminal group 352B is mounted on the surface layer 200a. This ground pattern 232F is a conductor pattern which is electrically connected to the main ground pattern 222F. The ground terminals 363 and 364 of the multiple terminal groups 351B and 352B are electrically connected to the main ground pattern 222F by the ground pattern 232F.

This ground pattern 232F is led from the main ground pattern 222F to the first region R1 via the side S1 of the first region R1. In this case, the ground pattern 232F is electrically connected to the ground terminal 392. In this way, the ground pattern 232F is led to the first region R1 via the ground terminal 392. Therefore, it is not necessary to change the inter-terminal distance for wiring the ground pattern 232F. Further, a connection structure of the ground pattern 232F in the terminal groups 351B and 352B and a connection structure of the ground pattern 232F between the terminal groups are the same as those of the ground pattern 211 in the third embodiment.

In this way, in the seventh embodiment, the ground pattern 231F is formed to connect the main ground pattern 221F and the ground terminals 361 and 362 of the terminal groups 351B and 352B in a single stroke manner. In other words, the ground terminals 361 and 362 of the LSI 300F are arranged so that the ground pattern 231F is formed in a single stroke manner. Further, in the seventh embodiment, the main ground pattern 221F and the ground pattern 231F are integrally formed as a single continuous conductor pattern.

In addition, the ground pattern 232F is formed to connect the main ground pattern 222F and the ground terminals 363 and 364 of the terminal groups 351B and 352B in a single stroke manner. In other words, the ground terminals 363 and 364 of the LSI 300F are arranged so that the ground pattern 232F is formed in a single stroke manner. Further, in the seventh embodiment, the main ground pattern 222F and the ground pattern 232F are integrally formed as a single continuous conductor pattern.

In the seventh embodiment, the capacitor group 371 and the capacitor group 372, which include the multiple capacitors connected between the power supply patterns 211C, 212C, and 213C and the ground patterns 231F and 232F, are mounted in the second region R2. In order to simplify the description, the two capacitor groups 371 and 372 are provided in the seventh embodiment, but three or more capacitor groups may be used.

Here, when the main power supply pattern 201C is the first main power supply pattern while the main power supply pattern 202C is the second main power supply pattern, the power supply pattern 211C is the first power supply pattern while the power supply pattern 212C is the second power supply pattern. The power supply terminals 321 and 322 of the terminal groups 351B and 352B are the first power supply terminals, the power supply terminal 323 of the terminal groups 351B and 352B is the second power supply terminal, and the power supply terminal 324 of the terminal groups 351B and 352B is the third power supply terminal. Further, the ground terminal 361 of the terminal groups 351B and 352B is the first ground terminal, and the ground terminal 362 of the terminal groups 351B and 352B is the second ground terminal.

In addition, when the main power supply pattern 202C is the first main power supply pattern while the main power supply pattern 203C is the second main power supply pattern, the power supply pattern 212C is the first power supply pattern while the power supply pattern 213C is the second power supply pattern. The power supply terminals 323 and 324 of the terminal groups 351B and 352B are the first power supply terminals, the power supply terminal 325 of the terminal groups 351B and 352B is the second power supply terminal, and the power supply terminal 326 of the terminal groups 351B and 352B is the third power supply terminal. Further, the ground terminal 363 of the terminal groups 351B and 352B is the first ground terminal, and the ground terminal 364 of the terminal groups 351B and 352B is the second ground terminal.

As described above, the main ground patterns 221F and 222F and the ground patterns 231F and 232F are disposed on the same surface layer 200a without crossing each other. Thus, the ground layer as the inner layer of the printed wiring board can be eliminated, and hence the number of layers of the printed wiring board can be reduced.

In particular, in the seventh embodiment, because the power supply wirings 201C to 203C and 211C to 213C, the ground wirings 221F, 222F, 231F, and 232F, and the signal wiring (not shown) are disposed on the surface layer 200a, the printed wiring board can be a single-sided board having a single layer.

In addition, the capacitor groups 371 and 372 can be disposed in a vicinity of the power supply terminal of the LSI 300F, and hence a potential fluctuation suppression effect due to transient current sink of the LSI 300F can be improved. As described above, in addition to the effect of the fourth embodiment, it is possible to further improve the potential fluctuation suppression effect.

Eighth Embodiment

Figure 11:
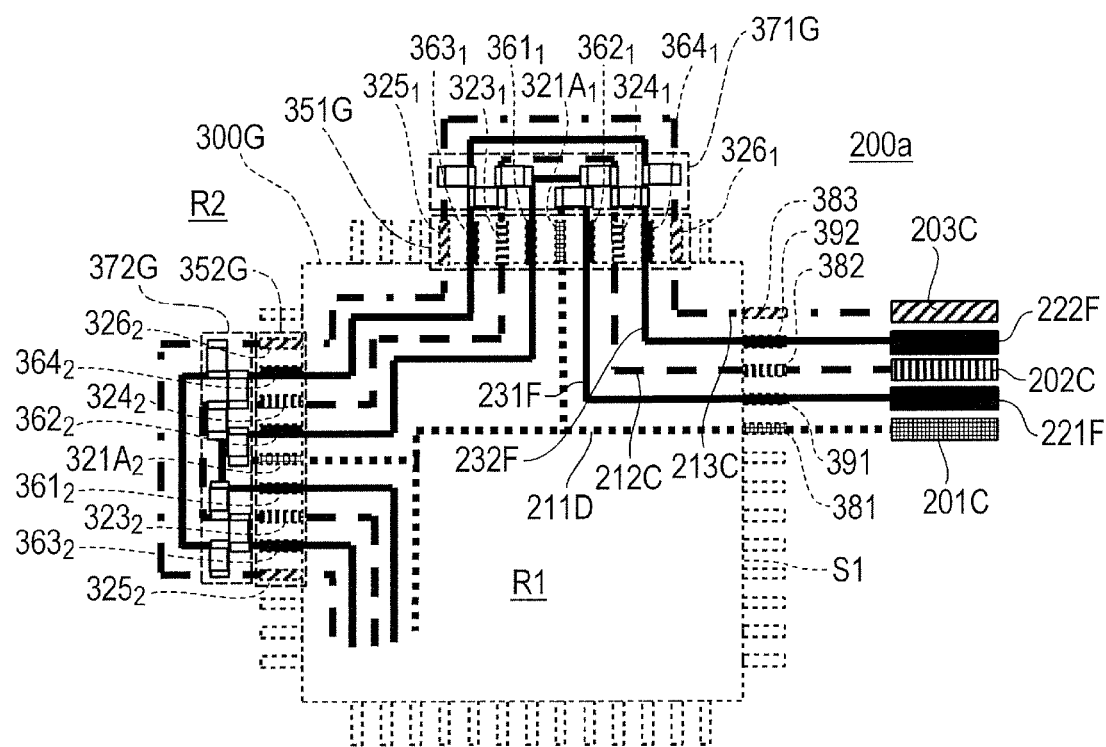
FIG. 11 is a plan view of a printed wiring board in a vicinity of the LSI according to an eighth embodiment of the present invention.

Next, a printed circuit board according to an eighth embodiment of the present invention is described. FIG. 11 is a plan view of the printed wiring board in a vicinity of the LSI according to the eighth embodiment of the present invention. In the eighth embodiment, the same structure as that of the first to seventh embodiments is denoted by the same numeral or symbol so that overlapping description is omitted.

In the seventh embodiment, there is described the case where the power supply pattern 211C is formed in a single stroke manner as illustrated in FIG. 10. However, the present invention is not limited thereto, and as illustrated in FIG. 11, a power supply pattern 211D may not be formed in a single stroke manner.

In the eighth embodiment, an LSI 300G includes two terminal groups 351G and 352G as multiple terminal groups. The terminal groups 351G and 352G of the LSI 300G each include the power supply terminals 323 to 326, and one power supply terminal 321A which is applied with a DC voltage different from that applied to the power supply terminals 323 to 326. Here, when the power supply terminal 321A is the first power supply terminal, the number of first power supply terminals is reduced to be smaller in the eighth embodiment than that in the seventh embodiment.

In addition, the terminal groups 351G and 352G each include the ground terminals 361 to 364. In the terminal groups 351G and 352G, the ground terminal 361 is disposed between the power supply terminal 321A and the power supply terminal 323, while the ground terminal 362 is disposed between the power supply terminal 321A and the power supply terminal 324. In addition, in the terminal groups 351G and 352G, the ground terminal 363 is disposed between the power supply terminal 323 and the power supply terminal 325, while the ground terminal 364 is disposed between the power supply terminal 324 and the power supply terminal 326.

The power supply pattern 211D is led from the main power supply pattern 201C to the first region R1 on the surface layer 200a and is wired to connect the power supply terminals 321A of the terminal groups 351G and 352G. In the eighth embodiment, as in the fifth embodiment, the power supply pattern 211D is wired to branch to the individual power supply terminals 321A in the first region R1. With this power supply pattern 211D, the power supply terminals 321A of the multiple terminal groups 351G and 352G are electrically connected to the main power supply pattern 201C.

A capacitor group 371G and a capacitor group 372G, which include multiple capacitors connected between the power supply patterns 211D, 212C, and 213C and the ground patterns 231F and 232F, are mounted in the second region R2. In order to simplify the description, the two capacitor groups 371G and 372G are provided in the eighth embodiment, but three or more capacitor groups may be used.

As described above, also in the eighth embodiment, the power supply potential fluctuation is reduced and the radiation noise is suppressed, while the main power supply patterns 201C to 203C and the power supply patterns 211D to 213C can be wired on the surface layer 200a. Therefore, the number of layers of the printed wiring board can be reduced.

In particular, in the eighth embodiment, because the power supply patterns 201C to 203C and 211D to 213C, the ground wirings 221F, 222F, 231F, and 232F, and the signal wiring (not shown) are disposed on the surface layer 200a, the printed wiring board can be a single-sided board having a single layer.

In addition, the capacitor groups 371G and 372G can be disposed in a vicinity of the power supply terminal of the LSI 300G, and hence a potential fluctuation suppression effect due to transient current sink of the LSI 300G can be improved. As described above, in addition to the effect of the fourth embodiment, it is possible to further improve the potential fluctuation suppression effect.

Ninth Embodiment

Figure 12:
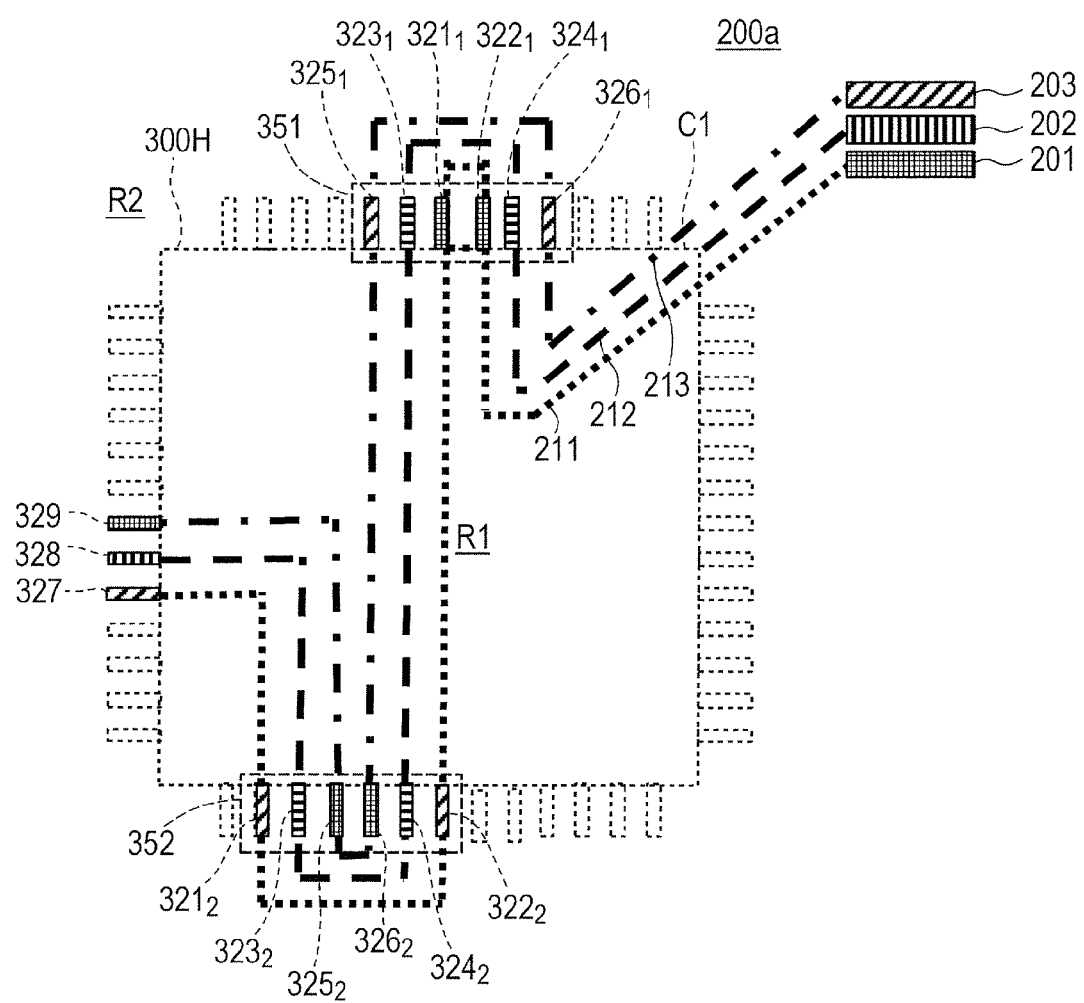
FIG. 12 is a plan view of a printed wiring board in a vicinity of the LSI according to a ninth embodiment of the present invention.

Next, a printed circuit board according to a ninth embodiment of the present invention is described. FIG. 12 is a plan view of the printed wiring board in a vicinity of the LSI according to the ninth embodiment of the present invention. In the ninth embodiment, the same structure as that of the first to eighth embodiments is denoted by the same numeral or symbol so that overlapping description is omitted.

In the first embodiment, as illustrated in FIG. 3, there is described the case where the power supply patterns 211, 212, and 213 are formed in a single stroke manner in the circumferential direction of the main body part 310, but the present invention is not limited thereto. As illustrated in FIG. 12, the power supply patterns 211, 212, and 213 are formed in a single stroke manner but may not be formed along the circumferential direction of the main body part.

In the ninth embodiment, an LSI 300H includes the two terminal groups 351 and 352 as the multiple terminal groups, and seventh to ninth power supply terminals 327, 328, and 329 disposed between the terminal group 351 and the terminal group 352 in the circumferential direction of the main body part of the LSI 300H.

The terminal group 351 includes the lands $321_1$ to $326_1$ to which the power supply terminals 321 to 326 are mounted similarly to the first embodiment, and the terminal group 352 includes the lands $321_2$ to $326_2$ to which the power supply terminals 321 to 326 are mounted similarly to the first embodiment. In the ninth embodiment, the power supply terminals 323 and 324 are disposed to sandwich the power supply terminals 321 and 322 in the terminal groups 351 and 352, and the power supply terminals 325 and 326 are disposed to sandwich the power supply terminals 323 and 324.

The power supply pattern 211 is led from the main power supply pattern 201 to the first region R1 via the corner part C1 of the first region R1. Further, the power supply pattern 211 connects the power supply terminal 321 and the power supply terminal 322 of the terminal groups 351 and 352 in the second region R2. In other words, the power supply pattern 211 connects the land $321_1$ and the land $322_1$ of a land group corresponding to the terminal group 351 and the land $321_2$ and the land $322_2$ of a land group corresponding to the terminal group 352 in the second region R2. In addition, the power supply pattern 211 connects the power supply terminal 321 and the power supply terminal 322 between the two terminal groups 351 and 352 in the first region R1. In other words, the power supply pattern 211 connects the land $321_1$ of the land group corresponding to the terminal group 351 and the land $322_2$ of the land group corresponding to the terminal group 352 in the first region R1. Further, the power supply pattern 211 connects the land $321_2$ of the land group corresponding to the terminal group 352 and the power supply terminal 327 in the first region R1.

In addition, the power supply pattern 212 is led from the main power supply pattern 202 to the first region R1 via the corner part C1 of the first region R1. Further, the power supply pattern 212 connects the power supply terminal 323 and the power supply terminal 324 of the terminal groups 351 and 352 in the second region R2. In other words, the power supply pattern 212 connects the land $323_1$ and the land $324_1$ of a land group corresponding to the terminal group 351 and the land $323_2$ and the land $324_2$ of a land group corresponding to the terminal group 352 in the second region R2. In addition, the power supply pattern 212 connects the power supply terminal 323 and the power supply terminal 324 between the two terminal groups 351 and 352 in the first region R1. In other words, the power supply pattern 212 connects the land $323_1$ of the land group corresponding to the terminal group 351 and the land $324_2$ of the land group corresponding to the terminal group 352 in the first region R1. Further, the power supply pattern 212 connects the land $323_2$ of the terminal group 352 and the power supply terminal 328 in the first region R1.

In addition, the power supply pattern 213 is led from the main power supply pattern 203 to the first region R1 via the corner part C1 of the first region R1. Further, the power supply pattern 213 connects the power supply terminal 325 and the power supply terminal 326 of the terminal groups 351 and 352 in the second region R2. In other words, the power supply pattern 213 connects the land $325_1$ and the land $326_1$ of a land group corresponding to the terminal group 351 and the land $325_2$ and the land $326_2$ of a land group corresponding to the terminal group 352 in the second region R2. In addition, the power supply pattern 213 connects the power supply terminal 325 and the power supply terminal 326 between the two terminal groups 351 and 352 in the first region R1. In other words, the power supply pattern 213 connects the land $325_1$ of the land group corresponding to the terminal group 351 and the land $326_2$ of the land group corresponding to the terminal group 352 in the first region R1. Further, the power supply pattern 213 connects the land $325_2$ of the land group corresponding to the terminal group 352 and the power supply terminal 329 in the first region R1.

In this way, in the ninth embodiment, the power supply patterns 211 to 213 are formed in a single stroke manner.

As described above, the multiple main power supply patterns 201 to 203 and the multiple power supply patterns 211 to 213 are disposed on the same surface layer 200a without crossing each other. Thus, the power supply layer as the inner layer of the printed wiring board can be eliminated, and hence the number of layers of the printed wiring board can be reduced.

The power supply pattern is formed along the circumferential direction also in the second to eighth embodiments, but the power supply pattern may not be formed along the circumferential direction similarly to the ninth embodiment.

The present invention is not limited to the embodiments described above, but many variations can be carried out within the technical concept of the present invention by a person having a common knowledge in this art.

There is described the case where one terminal group is disposed in each of three sides of the main body part of the LSI in the first embodiment, and there is described the case where one terminal group is disposed in each of two sides of the main body part of the LSI in the second to eighth embodiments, but the present invention is not limited thereto. If the LSI has two or more terminal groups, these terminal groups can be arranged in an arbitrary layout. For instance, multiple terminal groups may be arranged in one side, or one or more terminal groups may be arranged in each of all (four) sides of the main body part.

In addition, there is described the case where the LSI has a QFP type semiconductor package in the first to ninth embodiments, but the present invention is not limited thereto. For instance, the LSI may have a plastic leaded chip carrier (PLCC) type, small outline package (SOP) type, or small outline j-leaded (SOJ) type semiconductor package.

In addition, there is described the case where the LSI is operated by three power supplies (three different DC power supply voltages) in the first to ninth embodiments, but the present invention is not limited thereto. The present invention can be applied also to a case where the LSI is operated by two or more power supplies (two or more different DC power supply voltages). In this case, the number of main power supply patterns and power supply patterns are determined depending on the number of necessary power supplies.

In addition, there is described the case where one power supply circuit 400 is provided in the first to ninth embodiments, but multiple power supply circuits may be provided.

In addition, there is described the case where the numbers of the respective power supply terminals 323 to 326 are one in each of the terminal groups in the first to ninth embodiments, but the present invention is not limited thereto. The present invention can be applied also to a case where there are multiple power supply terminals. In other words, there may be one or more second power supply terminals, and there may be one or more third power supply terminals. For instance, when the power supply terminal 323 is the second power supply terminal, there may be multiple power supply terminals 323. In this case, the power supply pattern 212 (212C or 212F) may not be formed in a single stroke manner but can be wired on the surface layer 200a. Therefore, the number of layers of the printed wiring board can be reduced.

In addition, there is described the case where the number of the power supply terminals 321A is one in the second, fifth, and eighth embodiments, but the present invention is not limited thereto. The present invention can be applied also to a case where there are multiple power supply terminals 321A. In other words, there may be one or more first power supply terminals. In addition, there is described the case where the power supply terminals 321 and 322 are the first power supply terminals, that is, there are two first power supply terminals in the first, third, fourth, sixth, seventh, and ninth embodiments, but the present invention can be applied also to a case where there are three or more first power supply terminals.

In addition, there is described the case where the ground terminal is disposed at all the power supply terminals of the terminal groups so that the two ground wirings (the ground pattern and the main ground pattern) are disposed in the third, seventh, and eighth embodiments, but the present invention is not limited thereto. It is sufficient that there are at least one ground pattern and at least one main ground pattern. In this case, it is sufficient that the LSI has the ground terminals in the number that enables to wire one ground pattern.

In addition, the ground pattern 231 and the ground pattern 232 are led to the first region R1 via the different corner parts C1 and C2 in the third embodiment, but the ground patterns may be led to the first region R1 via the same corner part. Similarly, the ground patterns 231F and 232F are led to the first region R1 via the same side S1 in the seventh and eighth embodiments, but the ground patterns may be led to the first region R1 via different sides.

In addition, there is described the case where one LSI is provided as the semiconductor package mounted on the surface layer of the printed wiring board in the first to ninth embodiments, but the present invention can be applied also to a case where there are multiple LSIs as the semiconductor packages mounted on the surface layer of the printed wiring board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-138898, filed Jun. 20, 2012, which is hereby incorporated by reference herein in its entirety.

What is claimed is:

1. A printed circuit board, comprising:
a printed wiring board comprising:
  a first main power supply pattern to be applied with a first DC voltage;
  a second main power supply pattern to be applied with a second DC voltage different from the first DC voltage;
  a first power supply pattern which is formed on a surface layer and is electrically connected to the first main power supply pattern; and
  a second power supply pattern which is formed on the surface layer and is electrically connected to the second main power supply pattern;
a semiconductor package mounted on the surface layer of the printed wiring board, the semiconductor package comprising:
  a main body part comprising a semiconductor element which drives with the first DC voltage and the second DC voltage; and
  multiple terminal groups which are electrically connected to the semiconductor element and are arranged with spaces in a circumferential direction of the main body part so as to protrude externally from the main body part,
each of the multiple terminal groups comprising:
  a first power supply terminal and a second power supply terminal to be supplied with the first DC voltage via the first power supply pattern; and
  a third power supply terminal and a fourth power supply terminal to be supplied with the second DC voltage via the second power supply pattern, the third power supply terminal and the fourth power supply terminal being disposed to sandwich the first power supply terminal and the second power supply terminal,
the first power supply terminal, the second power supply terminal, the third power supply terminal, and the fourth power supply terminal being disposed in order of the third power supply terminal, the first power supply terminal, the second power supply terminal, and the fourth power supply terminal in the each of the multiple terminal groups,
wherein, when a region of the surface layer opposed to the main body part is defined as a first region and a region of the surface layer other than the first region is defined as a second region:
the first power supply pattern extending from the first main power supply pattern is led from the second region to the first region and is wired to connect the first power supply terminals and the second power supply terminals of the multiple terminal groups;
the second power supply pattern extending from the second main power supply pattern is led from the second region to the first region and is wired in a single stroke manner so as to connect the third power supply terminals and the fourth power supply terminals of the multiple terminal groups in this order;
the third power supply terminal and the fourth power supply terminal in the same terminal group are connected to each other in the second region;
the third power supply terminal of one of two different terminal groups among the multiple terminal groups and the fourth power supply terminal of another one of the two different terminal groups are connected to each other in the first region; and
the second power supply pattern is disposed on an outer perimeter side of the semiconductor package with respect to the first power supply pattern when viewed from a center of the semiconductor package.

2. The printed circuit board according to claim 1, wherein:
the first power supply pattern comprises a pattern in a single stroke;
the first power supply terminal and the second power supply terminal in the same terminal group are connected to each other in the second region; and
the first power supply terminal of one of two different terminal groups among the multiple terminal groups and the second power supply terminal of another one of the two different terminal groups are connected to each other in the first region.

3. The printed circuit board according to claim 1, wherein the first power supply pattern branches toward the first power supply terminal and the second power supply terminal after being led from the second region to the first region.

4. The printed circuit board according to claim 3, wherein the first power supply terminal and the second power supply terminal in the each of the multiple terminal groups are formed of a single power supply terminal.

5. The printed circuit board according to claim 1, wherein the main body part is a polygon when viewed from a direction perpendicular to a plane of the main body part, and the first power supply pattern and the second power supply pattern are wired from the second region to the first region via a corner part of the first region.

6. The printed circuit board according to claim 5, wherein the first power supply pattern and the second power supply pattern are wired via different corner parts of the first region.

7. The printed circuit board according to claim 1, wherein:
the main body part is a polygon when viewed from a direction perpendicular to a plane of the main body part;
the semiconductor package further comprises a seventh power supply terminal to be supplied with the first DC voltage and an eighth power supply terminal to be supplied with the second DC voltage, which are electrically connected to the semiconductor element and protrude externally from the main body part;
the first power supply pattern is wired to be connected to the seventh power supply terminal via the first power supply terminal and the second power supply terminal of the each of the multiple terminal groups; and
the second power supply pattern is wired to be connected to the eighth power supply terminal via the third power supply terminal and the fourth power supply terminal of the each of the multiple terminal groups.

8. The printed circuit board according to claim 1, wherein:
the printed wiring board further comprises:
a main ground pattern; and
a first ground pattern which is formed on the surface layer and is electrically connected to the main ground pattern;
the each of the multiple terminal groups of the semiconductor package further comprises:
a first ground terminal disposed between the first power supply terminal and the third power supply terminal; and
a second ground terminal disposed between the second power supply terminal and the fourth power supply terminal;
the first ground pattern extending from the main ground pattern is led from the second region to the first region and is wired in a single stroke manner so as to connect the multiple first ground terminals and the multiple second ground terminals of the multiple terminal groups in this order;
the first power supply terminal and the second power supply terminal in the same terminal group are connected to each other in the second region; and
the first power supply terminal of one of two different terminal groups among the multiple terminal groups and the second power supply terminal of another one of the two different terminal groups are connected to each other in the first region.

9. The printed circuit board according to claim 8, further comprising capacitors disposed between the first power supply pattern and the first ground pattern and between the second power supply pattern and the first ground pattern in a vicinity of the multiple terminal groups.

10. The printed circuit board according to claim 1, wherein:
the printed wiring board further comprises:
a third main power supply pattern to be applied with a third DC voltage different from the first DC voltage and the second DC voltage; and
a third power supply pattern electrically connected to the third main power supply pattern;
the each of the multiple terminal groups of the semiconductor package further comprises a fifth power supply terminal and a sixth power supply terminal to be supplied with the third DC voltage via the third power supply pattern, the fifth power supply terminal and the sixth power supply terminal being disposed to sandwich the first power supply terminal, the second power supply terminal, the third power supply terminal, and the fourth power supply terminal;
the first power supply terminal, the second power supply terminal, the third power supply terminal, the fourth power supply terminal, the fifth power supply terminal, and the sixth power supply terminal are disposed in order of the fifth power supply terminal, the third power supply terminal, the first power supply terminal, the second power supply terminal, the fourth power supply terminal, and the sixth power supply terminal in the each of the multiple terminal groups;
the third power supply pattern extending from the third main power supply pattern is led from the second region to the first region and is wired in a single stroke manner so as to connect the fifth power supply terminals and the sixth power supply terminals of the multiple terminal groups in this order;
the fifth power supply terminal and the sixth power supply terminal in the same terminal group are connected to each other in the second region;
the fifth power supply terminal of one of two different terminal groups among the multiple terminal groups and the sixth power supply terminal of another one of the two different terminal groups are connected to each other in the first region; and
the third power supply pattern is disposed on the outer perimeter side of the semiconductor package with respect to the second power supply pattern when viewed from the center of the semiconductor package.

11. The printed circuit board according to claim 10, wherein:
the first power supply pattern comprises a pattern in a single stroke;
the first power supply terminal and the second power supply terminal in the same terminal group are connected to each other in the second region; and
the first power supply terminal of one of two different terminal groups among the multiple terminal groups and the second power supply terminal of another one of the two different terminal groups are connected to each other in the first region.

12. The printed circuit board according to claim 10, wherein the first power supply pattern branches toward the first power supply terminal and the second power supply terminal after being led from the second region to the first region.

13. The printed circuit board according to claim 12, wherein the first power supply terminal and the second power supply terminal in the each of the multiple terminal groups are formed of a single power supply terminal.

14. The printed circuit board according to claim 10, wherein the main body part is a polygon when viewed from a direction perpendicular to a plane of the main body part, and the first power supply pattern and the third power supply pattern are wired from the second region to the first region via a corner part of the first region.

15. The printed circuit board according to claim 14, wherein at least one of the first power supply pattern and the third power supply pattern is wired to the first region via a corner part of the first region different from the corner part via which other power supply patterns are wired.

16. The printed circuit board according to claim 10, wherein:
the main body part is a polygon when viewed from a direction perpendicular to a plane of the main body part;
the semiconductor package further comprises a seventh power supply terminal to be supplied with the first DC voltage, an eighth power supply terminal to be supplied with the second DC voltage, and a ninth power supply terminal to be supplied with the third DC voltage, which are electrically connected to the semiconductor element and protrude externally from the main body part;
the first power supply pattern is wired to be connected to the seventh power supply terminal via the first power supply terminal and the second power supply terminal of the each of the multiple terminal groups;
the second power supply pattern is wired to be connected to the eighth power supply terminal via the third power supply terminal and the fourth power supply terminal of the each of the multiple terminal groups; and
the third power supply pattern is wired to be connected to the ninth power supply terminal via the fifth power supply terminal and the sixth power supply terminal of the each of the multiple terminal groups.

17. The printed circuit board according to claim 10, wherein:
the printed wiring board further comprises:
a main ground pattern; and
a first ground pattern and a second ground pattern which are formed on the surface layer and are electrically connected to the main ground pattern;
the each of the multiple terminal groups of the semiconductor package further comprises:
a first ground terminal disposed between the first power supply terminal and the third power supply terminal;
a second ground terminal disposed between the second power supply terminal and the fourth power supply terminal;
a third ground terminal disposed between the third power supply terminal and the fifth power supply terminal; and
a fourth ground terminal disposed between the fourth power supply terminal and the sixth power supply terminal;
the first ground pattern extending from the main ground pattern is led from the second region to the first region and is wired in a single stroke manner so as to connect the multiple first ground terminals and the multiple second ground terminals of the multiple terminal groups in this order;
the first power supply terminal and the second power supply terminal in the same terminal group are connected to each other in the second region;
the first power supply terminal of one of two different terminal groups among the multiple terminal groups and the second power supply terminal of another one of the two different terminal groups are connected to each other in the first region;
the second ground pattern extending from the main ground pattern is led from the second region to the first region and is wired in a single stroke manner so as to connect the multiple third ground terminals and the multiple fourth ground terminals of the multiple terminal groups in this order;

the third power supply terminal and the fourth power supply terminal in the same terminal group are connected to each other in the second region; and
the third power supply terminal of one of two different terminal groups among the multiple terminal groups and the fourth power supply terminal of another one of the two different terminal groups are connected to each other in the first region.

18. The printed circuit board according to claim 17, further comprising capacitors disposed between the first power supply pattern and the first ground pattern, between the first ground pattern and the second power supply pattern, between the second power supply pattern and the second ground pattern, and between the second ground pattern and the third power supply pattern in a vicinity of the multiple terminal groups.

19. A printed wiring board, comprising:
a first main power supply pattern to be applied with a first DC voltage;
a second main power supply pattern to be applied with a second DC voltage different from the first DC voltage;
a first power supply pattern which is formed on a surface layer and is electrically connected to the first main power supply pattern;
a second power supply pattern which is formed on the surface layer and is electrically connected to the second main power supply pattern; and
multiple land groups which are formed on the surface layer and are arranged with spaces, the multiple land groups each having multiple terminals mounted thereon for a semiconductor package to be mounted,
each of the multiple land groups comprising:
a first land and a second land to be supplied with the first DC voltage via the first power supply pattern; and
a third land and a fourth land to be supplied with the second DC voltage via the second power supply pattern, the third land and the fourth land being disposed to sandwich the first land and the second land,
the first land, the second land, the third land, and the fourth land being disposed in order of the third land, the first land, the second land, and the fourth land in the each of the multiple land groups,
wherein, when a region of the surface layer opposed to the main body part is defined as a first region and a region of the surface layer other than the first region is defined as a second region:
the first power supply pattern extending from the first main power supply pattern is led from the second region to the first region and is wired to connect the first lands and the second lands of the multiple land groups;
the second power supply pattern extending from the second main power supply pattern is led from the second region to the first region and is wired in a single stroke manner so as to connect the third lands and the fourth lands of the multiple land groups in this order;
the third land and the fourth land in the same land group are connected to each other in the second region;
the third land of one of two different land groups among the multiple land groups and the fourth land of another one of the two different land groups are connected to each other in the first region; and
the second power supply pattern is disposed on an outer perimeter side of the semiconductor package with respect to the first power supply pattern when viewed from a center of the semiconductor package.

20. The printed wiring board according to claim 19, further comprising:

a third main power supply pattern to be applied with a third DC voltage different from the first DC voltage and the second DC voltage; and a third power supply pattern electrically connected to the third main power supply pattern, wherein:

the each of the multiple land groups of the semiconductor package further comprises a fifth land and a sixth land to be supplied with the third DC voltage via the third land, the fifth land and the sixth land being disposed to sandwich the first land, the second land, the third land, and the fourth land;

the first land, the second land, the third land, the fourth land, the fifth land, and the sixth land are disposed in order of the fifth land, the third land, the first land, the second land, the fourth land, and the sixth land in the each of the multiple land groups;

the third power supply pattern extending from the third main power supply pattern is led from the second region to the first region and is wired in a single stroke manner so as to connect the fifth lands and the sixth lands of the multiple land groups in this order;

the fifth land and the sixth land in the same land group are connected to each other in the second region;

the fifth land of one of two different land groups among the multiple land groups and the sixth land of another one of the two different land groups are connected to each other in the first region; and the third power supply pattern is disposed on the outer perimeter side of the semiconductor package with respect to the second power supply pattern when viewed from the center of the semiconductor package.

21. The printed wiring board according to claim 20, further comprising:

a main ground pattern; and a first ground pattern and a second ground pattern which are formed on the surface layer and are electrically connected to the main ground pattern, wherein:

the each of the multiple land groups further comprises:

a first ground land disposed between the first land and the third land;

a second ground land disposed between the second land and the fourth land;

a third ground land disposed between the third land and the fifth land; and a fourth ground land disposed between the fourth land and the sixth land;

the first ground pattern extending from the main ground pattern is led from the second region to the first region and is wired in a single stroke manner so as to connect the multiple first ground lands and the multiple second ground lands of the multiple land groups in this order;

the first land and the second land in the same land group are connected to each other in the second region;

the first land of one of two different land groups among the multiple land groups and the second land of another one of the two different land groups are connected to each other in the first region;

the second ground pattern extending from the main ground pattern is led from the second region to the first region and is wired in a single stroke manner so as to connect the multiple third ground lands and the multiple fourth ground lands of the multiple land groups in this order;

the third land and the fourth land in the same land group are connected to each other in the second region; and the third land of one of two different land groups among the multiple land groups and the fourth land of another one of the two different land groups are connected to each other in the first region.

\* \* \* \* \*